(12) United States Patent
Lee et al.

(10) Patent No.: US 11,637,259 B2
(45) Date of Patent: Apr. 25, 2023

(54) ELECTROLUMINESCENT DEVICE, AND DISPLAY DEVICE COMPRISING THE SAME

(71) Applicant: SAMSUNG ELECTRONICS CO., LTD., Suwon-si (KR)

(72) Inventors: Yeonkyung Lee, Seongnam-si (KR); Eun Joo Jang, Suwon-si (KR); Hongkyu Seo, Anyang-si (KR); Dae Young Chung, Suwon-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 326 days.

(21) Appl. No.: 16/943,174

(22) Filed: Jul. 30, 2020

(65) Prior Publication Data
US 2021/0066633 A1  Mar. 4, 2021

(30) Foreign Application Priority Data

Aug. 29, 2019 (KR) .................. 10-2019-0106573

(51) Int. Cl.
| | |
|---|---|
| *H01L 51/50* | (2006.01) |
| *C09K 11/88* | (2006.01) |
| *C09K 11/08* | (2006.01) |
| *C09K 11/02* | (2006.01) |
| *H01L 51/00* | (2006.01) |
| *B82Y 40/00* | (2011.01) |
| *B82Y 20/00* | (2011.01) |

(52) U.S. Cl.
CPC ......... *H01L 51/502* (2013.01); *C09K 11/025* (2013.01); *C09K 11/0883* (2013.01); *C09K 11/883* (2013.01); *H01L 51/005* (2013.01); *H01L 51/0039* (2013.01); *H01L 51/5056* (2013.01); *H01L 51/5072* (2013.01); *H01L 51/5088* (2013.01); *B82Y 20/00* (2013.01); *B82Y 40/00* (2013.01)

(58) Field of Classification Search
CPC .. H01L 51/502; H01L 51/0039; H01L 51/005
See application file for complete search history.

(56) References Cited

U.S. PATENT DOCUMENTS

2019/0296255 A1* 9/2019 Kim ............... H01L 51/502

FOREIGN PATENT DOCUMENTS

| KR | 20130074815 A | 7/2013 |
|---|---|---|
| KR | 101725486 B1 | 4/2017 |
| KR | 101732877 B1 | 5/2017 |

* cited by examiner

*Primary Examiner* — Anthony Ho
(74) *Attorney, Agent, or Firm* — Cantor Colburn LLP

(57) ABSTRACT

An electroluminescent device and a display device including the device are disclosed, wherein the electroluminescent device includes a first electrode; a hole transport layer disposed on the first electrode; an emission layer disposed on the hole transport layer, the emission layer including quantum dots;

a self-assembled monomolecular layer disposed on the emission layer, the self-assembled monomolecular layer including self-assembled monomolecules; an electron transport layer disposed on the self-assembled monomolecular layer; and a second electrode disposed on the electron transport layer.

23 Claims, 22 Drawing Sheets

ELECTROLUMINESCENT DEVICE, AND DISPLAY DEVICE COMPRISING THE SAME

CROSS-REFERENCE TO RELATED APPLICATION

This application claims priority to Korean Patent Application No. 10-2019-0106573 filed in the Korean Intellectual Property Office on Aug. 29, 2019, and all the benefits therefrom under 35 U.S.C. § 119, the entire content of which is herein incorporated by reference.

BACKGROUND

1. Field

An electroluminescent device and a display device comprising the same are disclosed.

2. Description of the Related Art

Quantum dots are nanocrystal semiconductor materials having a diameter of less than or equal to approximately several nanometers to several tens of nanometers, and exhibit quantum confinement effects. Quantum dots generate stronger light in a narrow wavelength region than many commonly used phosphors. Quantum dots emit light as excited electrons transition from a conduction band to a valence band and the wavelengths, e.g., a peak wavelength, of the emitted light can depend upon particle size even in the same quantum dot material. Because quantum dots emit light of a shorter wavelength with smaller particle size, the emitted light can be varied to a desirable wavelength region by adjusting the particle size.

An emission layer including quantum dots and various types of electronic devices including the quantum dots may generally save production costs, compared with an organic light emitting diode using an emission layer including a phosphorescent and/or fluorescent material, and desirable colors may be emitted by a change in the particle size of the quantum dots even in the absence of other organic materials in the emission layer for emitting color light.

Luminous efficiency of the emission layer including quantum dots is determined by quantum efficiency of quantum dots, a balance of charge carriers, light extraction efficiency, leakage currents, and the like. That is, in order to improve luminous efficiency of the emission layer, the excitons may be advantageously controlled or confined to the emission layer, the holes and electrons may be smoothly transported to the quantum dots, or the leakage currents may be prevented.

SUMMARY

An embodiment provides an electroluminescent device having improved light emitting and life-span characteristics and a display device including the same.

According to an embodiment, an electroluminescent device includes a first electrode; a hole transport layer disposed on the first electrode; an emission layer disposed on the hole transport layer, the emission layer including quantum dots; a self-assembled monomolecular layer disposed on the emission layer, the self-assembled monomolecular layer including self-assembled monomolecules; an electron transport layer disposed on the self-assembled monomolecular layer; and a second electrode disposed on the electron transport layer.

The self-assembled monomolecules may be attached to the surface of the quantum dots.

The self-assembled monomolecules may have a first terminal end close to the surface of the quantum dots and a second terminal end far from the surface of the quantum dots, and the first terminal end may form a chemical bond with the surface of the quantum dots.

The first terminal end may include carboxylate, phosphoryl, or a combination thereof.

The self-assembled monomolecules may be derived from a compound represented by Chemical Formula 1.

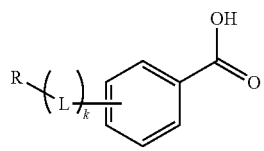

Chemical Formula 1

In Chemical Formula 1,
L is $-C(R_a)(R_b)-$, $-O-$, $-S-$, $-Se-$, $-N(R_c)-$, $-P(R_d)-$, $-COO-$, $-CO-$, or a combination thereof, wherein $R_a$, $R_b$, $R_c$, and $R_d$ are independently hydrogen, a halogen, a substituted or unsubstituted C1 to C20 alkyl group, a substituted or unsubstituted C1 to C20 aryl group, or a substituted or unsubstituted C1 to C20 heteroaryl group, R is hydrogen, a halogen, a substituted or unsubstituted C1 to C20 alkyl group, a substituted or unsubstituted C1 to C20 cycloalkyl group, a substituted or unsubstituted C1 to C20 aryl group, or a substituted or unsubstituted C1 to C20 heteroaryl group, and k is an integer of 0 to 4.

The self-assembled monomolecules may be derived from a compound represented by Chemical Formula 2.

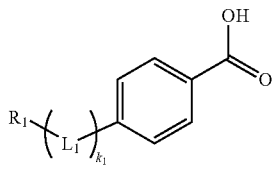

Chemical Formula 2

In Chemical Formula 2,
$L_1$ is $-C(R_a)(R_b)-$, $-O-$, or a combination thereof, wherein $R_a$, $R_b$, $R_c$, and $R_d$ are independently hydrogen, a halogen, a substituted or unsubstituted C1 to C20 alkyl group, a substituted or unsubstituted C1 to C20 aryl group, or a substituted or unsubstituted C1 to C20 heteroaryl group, $R_1$ is hydrogen, a halogen, or a substituted or unsubstituted C1 to C20 alkyl group, and $k_1$ is 0 or 1.

The self-assembled monomolecules may be dissolved in a solvent including water, ethanol, methanol, propanol, butanol, acetic acid, ethylene glycol, diethylene glycol, glycerine, isopropyl alcohol, 2-methoxy ethanol, acetone, acetonitrile, or a combination thereof.

The self-assembled monomolecular layer may have an average thickness of about 0.1 nm to about 5 nm.

The quantum dots may include a core including a first semiconductor nanocrystal and a shell including a second semiconductor nanocrystal disposed on the core and having a composition different from that of the first semiconductor nanocrystal.

The first semiconductor nanocrystal and the second semiconductor nanocrystal may independently include a Group II-VI compound, a Group III-V compound, a Group IV-VI compound, a Group IV element or compound, a Group I-III-VI compound, a Group I-II-IV-VI compound that does not include Cd, or a combination thereof.

At least a portion of the surfaces of the quantum dots may be attached to a hydrophobic ligand, including a compound derived from a carboxylic acid, a compound derived from thiol, or a combination thereof.

The quantum dots may emit first light in a predetermined wavelength region.

The first light may belong to one of a first wavelength region of about 380 nm to about 488 nm, a second wavelength region of about 490 nm to about 510 nm, a third wavelength region of about 511 nm to about 580 nm, a fourth wavelength region of about 582 nm to about 600 nm, and a fifth wavelength region of about 620 nm to about 680 nm.

The hole transport layer may include a poly(3,4-ethylenedioxythiophene), a poly(styrenesulfonate), a poly-N-vinylcarbazole, a polyphenylenevinylene, a polyparaphenylenevinylene, a polymethacrylate, a polyarylamine, a polyaniline, a polypyrrole, a poly(9,9-dioctylfluorene), poly(spiro-bifluorene), or any derivative of the aforementioned, tris(4-carbazol-9-ylphenyl)amine (TCTA), N,N'-diphenyl-N,N'-bis(3-methylphenyl)-(1,1'-biphenyl)-4,4'-diamine (TPD), N,N'-bis(3-methylphenyl)-N,N'-bis(phenyl)-2,7-diamino-9,9-spiro bifluorene (spiro-TPD), N,N'-bis(3-methylphenyl)-N,N'-bis(phenyl)-9,9-dioctylfluorene (DOFL-TPD), N,N'-di(naphthalen-1-yl)-N—N'-diphenyl-benzidine (NPB), N2,N7-di(naphthalen-1-yl)-9,9-dioctyl-N2,N7-diphenyl-9H-fluorene-2,7-diamine (DOFL-NPB), tris(3-methylphenylphenylamino)-triphenylamine (m-MTDATA), dipyrazino[2,3-f:2',3'-h]quinoxaline-2,3,6,7,10,11-hexanecarbonitrile (HAT-CN), di-[4-(N,N-di-p-tolyl-amino)-phenyl]cyclohexane (TAPC), N,N'-(4,4'-(cyclohexan-1,1-diyl)bis(4,1-phenylene))bis(N-(4-(6-(2-ethyloxetan-2-yloxy)hexyl)phenyl)-3,4,5-trifluoroaniline) (X-F6-TAPC), 4,4'-bis(N-carbazolyl)-1,1'-biphenyl (CBP), 2,6-bis(3-(9H-carbazol-9-yl)phenyl)pyridine (26DCzPPy), poly-TPD, a nickel oxide, a molybdenum oxide, a copper oxide, a vanadium oxide, a chromium oxide, a graphene oxide, or a combination thereof.

The electron transport layer may include an inorganic material nanoparticle, a quinolone-based compound, a triazine-based compound, a quinoline-based compound, a triazole-based compound, a naphthalene-based compound, or a combination thereof.

The electron transport layer may include a cluster layer of inorganic material nanoparticles.

The inorganic material nanoparticles may include salts of metals including zinc (Zn), magnesium (Mg), tin (Sn), zirconium (Zr), titanium (Ti), aluminum (Al), or a combination thereof.

A hole injection layer may be further included between the hole transport layer and the first electrode.

On the other hand, a display device includes the electroluminescent device according to an embodiment.

The electroluminescent device may exhibit improved light emitting and life-span characteristics. In addition, as described above, a display device including an electroluminescent device having improved light emitting and life-span characteristics may be provided.

DETAILED DESCRIPTION

Figure 1:
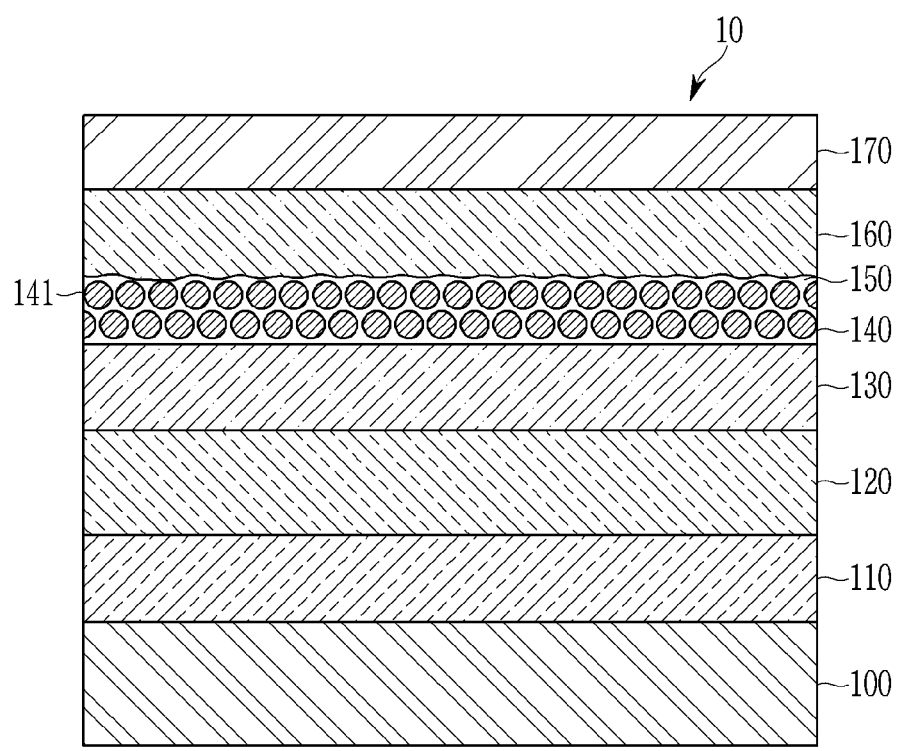
FIG. 1 is a schematic cross-sectional view illustrating an electroluminescent device according to an embodiment.

Example embodiments of the present disclosure will hereinafter be described in detail, and may be easily performed by a person having an ordinary skill in the related art. However, this disclosure may be embodied in many different forms, and is not to be construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined.

As used herein, when a definition is not otherwise provided, "substituted" refers to the case where in a compound or a functional group, hydrogen is replaced by a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group (—NRR', wherein R and R' are independently hydrogen or a C1 to C6 alkyl group), an azido group (—N$_3$), an amidino group (—C(=NH)NH$_2$), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxylic acid group or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), or a combination thereof.

As used herein, "Group" refers to a group of the Periodic Table. As used herein, "Group II" refers to Group IIA and Group IIB, and examples of Group II metal may be Cd, Zn, Hg, and Mg, but are not limited thereto.

As used herein, examples of "Group II metal that does not include Cd" refers to a Group II metal except Cd, for example Zn, Hg, Mg, etc.

As used herein, "Group III" refers to Group IIIA and Group IIIB, and examples of Group III metal may be Al, In, Ga, and TI, but are not limited thereto.

As used herein, "Group IV" refers to Group IVA and Group IVB, and examples of a Group IV metal may be Si, Ge, and Sn, but are not limited thereto. As used herein, the term "metal" may include a semi-metal such as Si.

As used herein, "Group I" refers to Group IA and Group IB, and examples may include Li, Na, K, Rb, and Cs, but are not limited thereto.

As used herein, "Group V" refers to Group VA, and examples may include nitrogen, phosphorus, arsenic, antimony, and bismuth, but are not limited thereto.

As used herein, "Group VI" refers to Group VIA, and examples may include sulfur, selenium, and tellurium, but are not limited thereto.

As used herein, "thickness" refers to "an average thickness" unless otherwise defined. The "average thickness" refers to an arithmetic average value of a thickness of a measurement object (e.g., layer, etc.) obtained from a scanning electron microscope image at random from several times to several tens of times.

In an embodiment, for a particle diameter of a particle in the present disclosure, although it may be quantitated by a measurement to show an average size of a group, the generally used method includes a mode diameter showing the maximum value of the distribution, a median diameter corresponding to the center value of integral distribution curve, a variety of average diameters (numeral average, length average, area average, mass average, volume average, etc.), and the like. Unless particularly mentioning otherwise, an average particle diameter means to a numeral average diameter in the present disclosure, and it is obtained by measuring D50 (particle diameter at a position of distribution rate of 50%).

As used herein, "solubility" refers to the ability of a solute to dissolve in a specific solvent. The solubility may be distinguished by polarity of the solvent as a reference. For example, when solubility is distinguished by the polarity of the solvent as a reference, the polarity may be divided by a dielectric constant, or a degree of dipole moment as a reference. The polarity of the solvent is a relative concept.

However, as used herein, the definition of "solubility" is not necessarily limited to the definition, and the "solubility" may be distinguished by a variety of known methods such as whether the solvent includes a chemical structure having a conjugated structure and the degree of relative polarity to water.

The term "derivative" is used herein to describe a name material and like materials with varied structural changes such as substituents that includes the base chemical structure of the name material. For example, a derivative of a polyaniline will include a substituted polyaniline or an oligomer having an aniline structure.

An electroluminescent device including quantum dots (hereinafter, referred to as a quantum dot electroluminescent device) are attracting attention as a next generation display device due to high color reproducibility of quantum dots and ease of solution processing. However, in such a quantum dot electroluminescent device, flows of holes in the emission layer including quantum dots is generally not as smooth or efficient as those of electrons for the reasons that follow. Accordingly, the quantum dot electroluminescent device may require improvement in the following.

For example, charges (electrons, holes) injected toward the emission layer tend to be recombined mainly on the interface of the hole transport layer and the emission layer or inside of the hole transport layer and/or the emission layer near to the interface. Herein, excitons inside the quantum dot electroluminescent device may be trapped and quenched by several energy levels generated on the interface of the hole transport layer and the emission layer and/or in an internal conduction band of the hole transport layer and/or the emission layer near to the interface.

Alternatively, the injected electrons and holes may be recombined not in the emission layer but in a non-emission layer (the hole transport layer) and thus form excitons. Herein, the excitons formed in the non-emission layer do not contribute to light emission of the device but are quenched and thus may deteriorate efficiency of the quantum dot electroluminescent device.

Alternatively, extra electrons not recombined among the injected electrons and holes are continuously present on the interface of the hole transport layer and the emission layer and thus may cause deterioration of materials included in the emission layer and/or the hole transport layer. In addition, the extra electrons may cause surface defects of the interface of the hole transport layer and/or the emission layer. These surface defects may quench the excitons and in addition, accelerate deterioration of the device, while driven at a constant current.

To address the above technical challenges, the inventors conducted research on a method of making a stable hole-electron balance inside the quantum dot electroluminescent device and thus improving luminous efficiency and life-span characteristics of the device.

The formation of a self-assembled monomolecular layer between the emission layer and the electron transport layer of the quantum dot electroluminescent device may secure a stable hole-electron balance and in addition, prevent a leakage current and thus realize excellent luminous efficiency and life-span characteristics.

FIG. 1 is a schematic cross-sectional view showing an electroluminescent device according to an embodiment.

An electroluminescent device 10 according to an embodiment includes a first electrode 110, a hole transport layer 130 disposed on the first electrode 110, a hole injection layer 120 disposed between the first electrode 110 and the hole transport layer 130 wherein the hole injection layer 120 may be omitted in consideration of the relationship with each constituent element, an emission layer 140 disposed on the hole transport layer 130, the emission layer 140 including quantum dots, a self-assembled monomolecular layer 150 disposed on the emission layer 140, the self-assembled monomolecular layer 150 including self-assembled monomolecules, an electron transport layer disposed on the self-assembled monomolecular layer 160, and a second electrode 170 disposed on the electron transport layer 160.

That is, the electroluminescent device 10 has a stacked structure in which the hole injection layer 120, hole transport layer 130, emission layer 140, self-assembled monomolecular layer 150, and electron transport layer 160 are disposed between the first electrode 110 and the second electrode 170 facing each other.

The electroluminescent device 10 according to an embodiment may supply light to the emission layer 140 through the first electrode 110 and the second electrode 170 to generate light by electroluminescence of the quantum dots 141. The electroluminescent device 10 may generate light having various wavelength ranges according to the materials, sizes, and detailed structures of the quantum dots 141 of the emission layer 140.

In an embodiment, the first electrode 110 may be directly connected to a driving power source so that it may function to flow a current to the emission layer 140. The first electrode 110 may include a material having light transmittance in at least visible light wavelength region but is not limited thereto. The first electrode 110 may include a material having light transmittance in an infrared or ultraviolet (UV) wavelength region. For example, the first electrode 110 may be an optically transparent material.

In an embodiment, the first electrode 110 may include molybdenum oxide, tungsten oxide, vanadium oxide, rhenium oxide, niobium oxide, tantalum oxide, titanium oxide, zinc oxide, nickel oxide, copper oxide, cobalt oxide, manganese oxide, chromium oxide, indium oxide, or a combination thereof.

However, the first electrode 110 according to an embodiment is not necessarily limited thereto but may include a material further having light transmittance with respect to light in an infrared ray or ultraviolet (UV) wavelength region or a semi-permeable material selectively transmitting light in a particular wavelength region and conduct a function of reflecting light in a visible light wavelength region and turning it back toward the second electrode 170.

Meanwhile, in an embodiment, the first electrode 110 may be disposed on the substrate 100 as shown in FIG. 1. The substrate 100 may be a transparent insulating substrate or may be made of a ductile material. The substrate 100 may include glass or a polymer material in a film having a glass transition temperature (Tg) of greater than about 150° C. For example, it includes a COC (cycloolefin copolymer) or COP (cycloolefin polymer) based material.

In an embodiment, the substrate 100 may support the hole injection layer 120, the hole transport layer 130, the emission layer 140, and the electron transport layer 160 disposed between the first electrode 110 and the second electrode 160. However, the substrate 100 of the electroluminescent device 10 according to an embodiment may not be disposed under the first electrode 110, but the substrate 100 may be disposed on the second electrode 160 or may be omitted, as needed.

The second electrode 160 includes an optically transparent material and may function as a light-transmitting electrode to transmit light generated in the emission layer 140 which will be described later. In an embodiment, the second electrode 160 may include at least one of silver (Ag), aluminum (Al), copper (Cu), gold (Au), an alloy thereof, molybdenum oxide, tungsten oxide, vanadium oxide, rhenium oxide, niobium oxide, tantalum oxide, titanium oxide, zinc oxide, nickel oxide, copper oxide, cobalt oxide, manganese oxide, chromium oxide, indium oxide, or a combination thereof.

However, the second electrode 170 according to an embodiment is not necessarily limited thereto but includes a semi-permeable material selectively transmitting light in a particular wavelength region and may conduct a function of reflecting light in a visible light wavelength region and turning it back toward the first electrode 110.

When the second electrode 170 functions as a reflecting electrode, the first electrode 110 may be a light-transmitting electrode formed of a material transmitting light in at least visible light wavelength region or a semi-permeable electrode selectively transmitting light in a particular wavelength region.

Each of the first electrode 110 and the second electrode 160 may be formed by depositing a material for forming an electrode on the substrate 100 or an organic layer by a method such as sputtering.

Meanwhile, the electroluminescent device 10 according to an embodiment may have a conventional structure in which the substrate 100 and each constituent element are disposed in the above-described stacking order as shown in FIG. 1.

However, one embodiment is not necessarily limited to this structure.

The hole injection layer 120 may be disposed directly on the first electrode 110. The hole injection layer 120 may serve to supply holes to the emission layer 140 together with the hole transport layer 130. However, the hole injection layer 120 may be omitted in consideration of the thickness, material, and the like of the hole transport layer 130.

The hole injection layer 120 may be formed of a p-type semiconductor or a material doped with a p-type semiconductor. The hole injection layer 120 may include, for example poly(3,4-ethylenedioxythiophene) (PEDOT) or a derivative thereof, poly(styrenesulfonate) (PSS) or a derivative thereof, poly-N-vinylcarbazole (PVK) or a derivative thereof, polyphenylene vinylene or a derivative thereof, poly p-phenylene vinylene (PPV) or a derivative thereof, polymethacrylate or a derivative thereof, poly(9,9-octylfluorene) or a derivative thereof, poly(spiro-bifluorene) or a derivative thereof, tris(4-carbazolyl-9-ylphenyl)amine (TCTA), N,N'-diphenyl-N,N'-bis(3-methylphenyl)-(1,1'-biphenyl)-4,4'-diamine (TPD), N,N'-bis(3-methylphenyl)-N,N'-bis(phenyl)-2,7-diamino-9,9-spirobifluorene (spiro-TPD), N,N'-bis(3-methylphenyl)-N,N'-bis(phenyl)-9,9-dioctylfluorene (DOFL-TPD), N,N'-di(naphthalen-1-yl)-N—N'-diphenyl-benzidine (NPB), N2,N7-di(naphthalen-1-yl)-9,9-dioctyl-N2,N7-diphenyl-9H-fluorene-2,7-diamine (DOFL-NPB), tris(3-methylphenylphenylamino)-triphenylamine (m-MTDATA), 1,4,5,8,9,11-hexaneazatriphenylenehexanecarbonitrile (HAT-CN), di-[4-(N,N-di-p-tolyl-amino)-phenyl]cyclohexane (TAPC), N,N'-(4,4'-(cyclohexan-1,1-diyl)bis(4,1-phenylene))bis(N-(4-(6-(2-ethyloxetan-2-yloxy)hexyl)phenyl)-3,4,5-trifluoroaniline) (X-F6-TAPC), 4,4'-bis(N-carbazolyl)-1,1'-biphenyl (CBP), 2,6-bis(3-(9H-carbazol-9-yl)phenyl)pyridine (26DCzPPy), poly-TPD, nickel oxide, molybdenum oxide, copper oxide, vanadium oxide, chromium oxide, graphene oxide, or a combination thereof, but is not limited thereto.

The hole transport layer 130 may be disposed on the first electrode 110, for example on the first electrode 110 and the hole injection layer 120. The hole transport layer 130 serves to supply and transport holes to the emission layer 140. The hole transport layer 130 is formed directly under the emission layer 140, and is in direct contact with the emission layer 140.

In an embodiment, the hole transport layer 130 may include a material having hole transport properties. Examples of the material having hole transport properties include a p-type semiconductor or a material doped with a p-type semiconductor. The material having hole transport properties are not limited to specific materials and may include a polymer, an oligomer, a metal oxide, or a combination thereof.

Examples of the material having hole transport properties may include a poly(3,4-ethylenedioxythiophene) derivative, a poly(styrenesulfonate) derivative, a poly-N-vinylcarbazole derivative, a polyphenylenevinylene derivative, a polyparaphenylenevinylene derivative, a polymethacrylate derivative, a polyarylamine derivative, a polyaniline derivative, a polypyrrole derivative, a poly(9,9-dioctylfluorene) derivative, a poly(spiro-bifluorene) derivative, tris(4-carbazolyl-9-ylphenyl)amine (TCTA), N,N'-diphenyl-N,N'-bis(3-methylphenyl)-(1,1'-biphenyl)-4,4'-diamine (TPD), N,N'-bis(3-methylphenyl)-N,N'-bis(phenyl)-2,7-diamino-9,9-spirobifluorene (spiro-TPD), N,N'-bis(3-methylphenyl)-N,N'-bis(phenyl)-9,9-dioctylfluorene (DOFL-TPD), N,N'-di(naphthalen-1-yl)-N—N'-diphenyl-benzidine (NPB), N2,N7-di(naphthalen-1-yl)-9,9-dioctyl-N2,N7-diphenyl-9H-fluorene-2,7-diamine (DOFL-NPB), tris(3-methylphenylphenylamino)-triphenylamine (m-MTDATA), 1,4,5,8,9,11-hexaneazatriphenylenehexanecarbonitrile (HAT-CN), di-[4-(N,N-di-p-tolyl-amino)-phenyl]cyclohexane (TAPC), N,N'-(4,4'-(cyclohexan-1,1-diyl)bis(4,1-phenylene))bis(N-(4-(6-(2-ethyloxetan-2-yloxy)hexyl)phenyl)-3,4,5-trifluoroaniline) (X-F6-TAPC), 4,4'-bis(N-carbazolyl)-1,1'-biphenyl (CBP), 2,6-bis(3-(9H-carbazol-9-yl)phenyl)pyridine (26DCzPPy), poly-TPD, nickel oxide, molybdenum oxide, copper oxide, vanadium oxide, chromium oxide, graphene oxide, or a combination thereof, but are not limited thereto.

In an embodiment, a thickness of the hole transport layer 130 may be variously changed in consideration of a hole-electron balance with the hole injection layer 120, the hole transport layer 130, and/or the emission layer 140 in the device, but it may be for example greater than or equal to about 10 nm, greater than or equal to about 15 nm, or greater than or equal to about 20 nm, and for example, less than or equal to about 80 nm, less than or equal to about 70 nm, less than or equal to about 60 nm, or less than or equal to about 50 nm, for example about 10 nm to about 80 nm, about 10 nm to about 70 nm, about 10 nm to about 60 nm, about 10 mm to about 50 nm, about 10 nm to about 40 nm, or about 20 nm to about 40 nm.

For example, the hole transport layer 130 may be formed through a wet coating process such as spin-coating and the like. For example, the hole transport layer 130 and the emission layer 140 and specifically, the hole transport layer 130 and the emission layer 140 all may be formed by using the wet coating process. Accordingly, the hole transport layer 130 and/or the emission layer 140 may be formed in a simple method.

In addition, in an embodiment, the hole transport layer 130 and the emission layer 140 may use materials having relatively different solubility. For example, the hole transport layer 130 may be formed by using a material having excellent solubility for an aromatic non-polar solvent, and the emission layer 140 may be formed by using a material having excellent solubility for an aliphatic non-polar solvent. Accordingly, even though a solution process may be used to form the hole transport layer 130 and the emission layer 140 to directly contact each other, the emission layer 140 may be formed without surface damage of the hole transport layer 130 due to different solubility of the hole transport layer 130 and the emission layer 140.

For example, when the hole transport layer 130 is formed of a poly[(9,9-dioctylfluoren-2,7-diyl)-co-(4,4'-(N-4-butylphenyl)diphenylamine)] (TFB) polymer, a precursor solution including a TFB precursor polymer and the aromatic non-polar solvent (e.g., toluene, xylene, etc.) is spin-coated on the first electrode 110 or the hole injection layer 120 and then, heat-treated, for example, at about 150° C. to about 1800° C. for 30 minutes under an inert gas atmosphere of N2 or under vacuum to form the hole transport layer 130 formed of TFB, and then, the emission layer 140 may be easily formed thereon by using the aliphatic non-polar solvent (e.g., octane, nonane, cyclohexane, etc.) in the solution method.

In this way, when the hole transport layer 130 and the emission layer 140 are formed to have different relative solubility, the hole transport layer 130 and the emission layer 140 may be more easily formed by using the solution process, and in addition, the hole transport layer 130 may be minimized from the surface damage by the organic solvent and the like during formation of the emission layer 140.

The emission layer 140 may be disposed on the hole transport layer 130 and may include quantum dots 141. The emission layer 140 is a site where electrons and holes transported by a current supplied from the first electrode 110 and the second electrode 170, the electrons and holes are combined in the emission layer 140 to generate excitons, and the generated excitons are transited from an exited state to a ground state to emit light in a wavelength corresponding to the size of the quantum dots 141. That is, the quantum dots 141 impart electroluminescence to the emission layer 140.

Particularly, the quantum dots 141 may have a discontinuous energy bandgap by the quantum confinement effect and incident light may be converted into light having a particular wavelength and then radiated. Therefore, the emission layer 140 including the quantum dots 141 may generate light having improved color reproducibility and color purity.

In an embodiment, the emission layer 140 may emit light in a predetermined wavelength region by the quantum dots 141. In an embodiment, the first light belongs to a visible light region, for example, one of a first wavelength region of about 380 nm to about 488 nm, a second wavelength region of about 490 nm to about 510 nm, a third wavelength region of about 511 nm to about 580 nm, a fourth wavelength region of about 582 nm to about 600 nm, and a fifth wavelength region of about 620 nm to about 680 nm.

In an embodiment, the quantum dots 141 may emit blue light in a first wavelength region of about 380 nm to about 488 nm. In this case, the emission layer 140 may be a blue light emission layer. Meanwhile, an embodiment is not limited thereto, and the quantum dots 141 may also emit green light in a third wavelength region of about 510 nm to about 580 nm, or red light in a fifth wavelength region of about 620 nm to about 680 nm.

However, an embodiment is not necessarily limited thereto, and the first light may emit ultraviolet (UV) light in a wavelength region of less than about 380 nm, or infrared light in a wavelength region of greater than or equal to about 680 nm.

In an embodiment, materials of the quantum dots 141 are not particularly limited and known or commercially available quantum dots may be used.

In an embodiment, the quantum dots 141 may include a core including a first semiconductor nanocrystal and a shell including a second semiconductor nanocrystal having a composition different from the first semiconductor nanocrystal and disposed on the core.

In an embodiment, the core and the shell may have an interface, and an element of at least one of the core or the shell in the interface may have a concentration gradient wherein the concentration of the element(s) of the shell decreases toward the core. In an embodiment, the quantum dots may have a structure (core-single shell structure) that includes a core and one layered shell surrounding the core. In this case, the single shell structure may have a single composition or concentration gradient.

However, an embodiment is not necessarily limited thereto, and the quantum dots 141 may have a structure including a core and a multi-layered shell surrounding the core. Herein, the multi-layered shell structure has a structure of two or more shells and each layer may have a single composition or an alloy or may have a concentration gradient.

When the quantum dots 141 have a core-shell structure, a material composition of the shell has a larger energy bandgap than that of the core, which may exhibit an effective quantum confinement effect. However, the embodiment is not limited thereto. Meanwhile, in the multi-layered shell, a shell that is outside of the core has may have a higher energy bandgap than a shell that is near to the core and the quantum dot(s) having a core-multi-layered shell structure may have an ultraviolet (UV) to infrared wavelength range.

In an embodiment, the first semiconductor nanocrystal included in the core and the second semiconductor nanocrystal included in the shell may independently include a Group II-VI compound that does not include Cd, a Group III-V compound, a Group IV-VI compound, a Group IV element or compound, a Group compound, a Group I-II-IV-VI compound that does not include Cd, or a combination thereof. That is, the quantum dots 141 according to an embodiment may be a non-cadmium-based quantum dot. Like this, when the quantum dot 141 is composed of a non-cadmium-based quantum dot, it has no toxicity compared with a conventional cadmium-based quantum dots and thus is not dangerous and is environmentally-friendly.

The Group II-VI compound may be a binary element compound such as ZnS, ZnSe, ZnTe, ZnO, HgS, HgSe, HgTe, MgSe, MgS, or a mixture thereof; a ternary element compound such as ZnSeS, ZnSeTe, ZnSTe, HgSeS, HgSeTe, HgSTe, HgZnS, HgZnSe, HgZnTe, MgZnSe, MgZnS, or a mixture thereof; or a quaternary element compound such as HgZnTeS, HgZnSeS, HgZnSeTe, HgZnSTe, or a mixture thereof. The Group II-VI compound may further include a Group III metal.

The Group III-V compound may be a binary element compound such as GaN, GaP, GaAs, GaSb, AlN, AlP, AlAs, AlSb, InN, InP, InAs, InSb, or a mixture thereof; a ternary element compound such as GaNP, GaNAs, GaNSb, GaPAs, GaPSb, AlNP, AlNAs, AlNSb, AlPAs, AlPSb, InNP, InNAs, InNSb, InPAs, InPSb, InZnP, or a mixture thereof; and a quaternary element compound such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a mixture thereof. The Group III-V compound may further include a Group II metal (InZnP).

The Group IV-VI compound may be binary element compound such as SnS, SnSe, SnTe, PbS, PbSe, PbTe, or a mixture thereof; a ternary element compound such as SnSeS, SnSeTe, SnSTe, PbSeS, PbSeTe, PbSTe, SnPbS, SnPbSe, SnPbTe, or a mixture thereof; and a quaternary element compound such as SnPbSSe, SnPbSeTe, SnPbSTe, or a mixture thereof. Examples of the Group compound may be CuInSe$_2$, CuInS$_2$, CuInGaSe, or CuInGaS, are not limited thereto. Examples of the Group I-II-IV-VI compound may be CuZnSnSe or CuZnSnS, are not limited thereto. Examples of the Group IV compound may be a single substance such as Si, Ge, or a mixture thereof; or a binary element compound such as SiC, SiGe, or a mixture thereof.

The binary element compound, the ternary element compound, or the quaternary element compound respectively exists in a uniform concentration in the particle or in partially different concentrations in the same particle.

The quantum dot 141 may have quantum efficiency of greater than or equal to about 10%, for example, greater than or equal to about 20%, greater than or equal to about 30%, greater than or equal to about 40%, greater than or equal to about 50%, greater than or equal to about 60%, greater than or equal to about 70%, greater than or equal to about 90%, or even 100%.

In a display, the quantum dots 141 may have a relatively narrow emission spectrum so as to improve color purity or color reproducibility. The quantum dots 141 may have for example a full width at half maximum (FWHM) of a photoluminescence wavelength spectrum of less than or equal to about 45 nm, less than or equal to about 40 nm, or less than or equal to or about 30 nm. Within the ranges, color purity or color reproducibility of a device may be improved.

The quantum dots 141 may have a particle diameter (the longest diameter for a non-spherically shaped particle) of about 1 nm to about 100 nm. For example, the quantum dots 141 may have a particle diameter (the longest diameter for a non-spherically shaped particle) of about 1 nm to about 20 nm, for example about 1 nm to about 15 nm, about 1 nm to about 14 nm, about 1 nm to about 3 nm, about 1 nm to about 12 nm, about 1 nm to about 11 nm, or about 1 nm to about 10 nm.

In addition, the shapes of the quantum dots 141 may be general shapes in this art and thus may not be particularly limited. For example, the quantum dots may have a spherical, oval, tetrahedral, pyramidal, cuboctahedral, cylindrical, polyhedral, multi-armed, or cubic nanoparticle, nanotube, nanowire, nanofiber, nanosheet, or a combination thereof. The quantum dots may have any cross-sectional shape.

The quantum dots 141 may be commercially available or may be synthesized in any method. For example, several nanometer-sized quantum dots may be synthesized according to a wet chemical process. In the wet chemical process, precursor materials react in an organic solvent to grow crystal particles. Herein, organic solvents or surfactants for forming ligands are naturally coordinated to the surfaces of the quantum dots to control the growth of crystals. Specific types of organic solvents or surfactants for forming ligands are known.

The organic solvents or surfactants for forming ligands may be selected appropriately. Examples of the organic solvent may include C6 to C22 primary amine such as hexanedecylamine; C6 to C22 secondary amine such as dioctylamine; C6 to C40 tertiary amine such as trioctylamine; nitrogen-containing heterocyclic compounds such as pyridine; C6 to C40 olefin such as octadecene; C6 to C40 aliphatic hydrocarbon such as hexane, octane, hexanedecane, octadecane, or squalane; aromatic hydrocarbon substituted with a C6 to C30 alkyl group such as phenyldodecane, phenyltetradecane, or phenyl hexanedecane; primary, secondary, or tertiary phosphine (e.g., trioctylphosphine) substituted with at least one (e.g., 1, 2, or 3) C6 to C22 alkyl group; phosphine oxide (e.g. trioctylphosphine oxide) substituted with at least one (e.g., 1, 2, or 3) C6 to C22 alkyl group; C12 to C22 aromatic ether such as phenyl ether, benzyl ether; or a combination thereof.

Examples of the surfactants for forming ligands may include RCOOH, RNH$_2$, R$_2$NH, R$_3$N, RSH, RH$_2$PO, R$_2$HPO, R$_3$PO, RH$_2$P, R$_2$HP, R$_3$P, ROH, RCOOR', RPO(OH)$_2$, RHPOOH, RHPOOH (wherein, R and R' are independently hydrogen, a C1 to C40 substituted or unsubstituted aliphatic hydrocarbon, or C6 to C40 substituted or unsubstituted aromatic hydrocarbon, or a combination thereof, and in each ligand, at least one R is not hydrogen), or a combination thereof, is not limited thereto.

Since organic solvents coordinated to the surfaces of the quantum dots may affect stability in the device, excess materials (organic solvents, surfactants for forming ligands, or combinations thereof) that are not coordinated to the surface of the nanocrystals may be removed by excessively pouring them into a non-solvent and centrifuging the resultant mixture. Specific examples of the non-solvent include, but are not limited to, acetone, ethanol, and methanol. After removing excess material, the amount of materials coordinated to the surfaces of the quantum dots may be less than or equal to about 50 weight percent (wt %), for example, less than or equal to about 30 wt %, less than or equal to about 20 wt %, or less than or equal to about 10 wt % of the weight of the quantum dots. The materials coordinated to the surfaces of the quantum dots may include ligands, organic solvents, or a combination thereof. The materials coordinated to the surfaces of the quantum dots, specifically the ligands, may impart dispersion to the quantum dots.

In an embodiment, at least a portion of the surfaces of the quantum dots 141 may have ligands attached thereto. In an embodiment, the ligand may be a hydrophobic ligand. In an embodiment examples of the hydrophobic ligand may be a compound derived from a carboxylic acid, a compound derived from thiol, or a combination thereof.

The hydrophobic moiety may include for example a C4 to C20 alkyl group, a C4 to C20 alkenyl group, a C4 to C20 alkynyl group, or a combination specific, and a moiety that is bound to the surface of the quantum dots may be for example a carboxylate (—COO—) moiety, a thiolate (—S—) moiety, etc.

In an embodiment, examples of compounds derived from the carboxylic acid may be compounds derived from fatty acid such as oleate, stearate, palmitate, and the like. In an embodiment, examples of compounds derived from the thiol may be C6 to C20 aliphatic thiolate.

For example, if the quantum dots 141 have hydrophobic ligands as described above, the emission layer 140 including the same may also be non-polar when viewed as a whole. In addition, the quantum dots to which the hydrophobic ligands are attached have solvent selectivity for non-polar solvents, specifically aliphatic non-polar solvents. Accordingly, even if the emission layer 140 is formed by using a solution process directly on the hole transport layer 130 having solvent selectivity for the aromatic non-polar solvent, the surface of the hole transport layer 130 may be minimized by organic solvents during the formation of the emission layer 140.

A thickness of the emission layer 140 may vary depending on the materials of the quantum dots 141, the types of (hydrophobic) ligands, and the contents of other constituent elements in the emission layer, but it may be less than or equal to about 50 nm, for example less than or equal to about 40 nm, less than or equal to about 30 nm, or less than or equal to about 20 nm and for example greater than or equal to about 5 nm, greater than or equal to about 6 nm, greater than or equal to about 7 nm, greater than or equal to about 8 nm, greater than or equal to about 9 nm, greater than or equal to about 10 nm, greater than or equal to about 11 nm, greater than or equal to about 12 nm, greater than or equal to about 13 nm, greater than or equal to about 14 nm, or greater than or equal to about 15 nm, or for example about 5 nm to about 50 nm, about 5 nm to about 40 nm, about 5 nm to about 30 nm, or about 10 nm to about 30 nm.

In an embodiment, the self-assembled monomolecular layer 150 is disposed on a surface (e.g., an upper surface) of the emission layer 140. In an embodiment, the self-assembled monomolecular layer 150 may be disposed to cover a portion or all of the surface (e.g., an upper surface) of the emission layer 140.

The self-assembled monomolecular layer 150 may function as a type of surface-modifying layer that changes physical and chemical characteristics of the surface of the emission layer 140. In an embodiment, the self-assembled monomolecular layer 150 may perform a function of removing or minimizing voids and/or cracks present on the surface of the emission layer 140.

In an embodiment, an average thickness of the self-assembled monomolecular layer 150 may vary depending on materials of the self-assembled monomolecular layer 150, thicknesses of the emission layer 140, and materials and sizes of the quantum dots 141 but it may be for example greater than or equal to about 0.1 nm, greater than or equal to about 0.5 nm, or greater than or equal to about 1 nm and for example less than or equal to about 5 nm, or less than or equal to about 4 nm, or for example about 0.1 nm to about 5 nm, or about 0.5 nm to about 5 nm.

When the average thickness of the self-assembled monomolecular layer 150 is less than about 0.1 nm, removal effects of voids and/or cracks present on the surface of the emission layer 140 may be insufficient. Therefore, improvement effects of the light emitting and life-span characteristics of the electroluminescent device 10 by the self-assembled monomolecular layer 150 may be insignificant.

On the other hand, when the average thickness of the self-assembled monomolecular layer 150 exceeds about 5 nm, the self-assembled monomolecular layer 150 may instead deteriorate light emitting characteristics by interfering and/or blocking movement of electrons.

Figure 2:
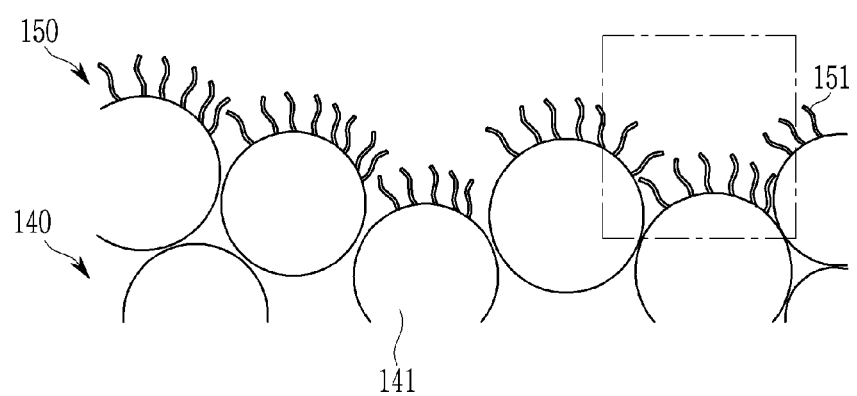
FIG. 2 is a schematic view illustrating an arrangement relationship between an emission layer and a self-assembled monolayer in the electroluminescent device according to one embodiment.

FIG. 2 is a schematic view illustrating an arrangement relationship between an emission layer and a self-assembled monolayer in the electroluminescent device according to one embodiment.

Referring to FIG. 2, the self-assembled monomolecular layer 150 may include a self-assembled monomolecules 151. The self-assembled monomolecular layer 150 may be composed of a plurality of self-assembled monomolecules 151. For example, the main component constituting the self-assembled monomolecular layer 150 may be a self-assembled monomolecules 151. For example, the self-assembled monomolecular layer 150 may be composed of a plurality of self-assembled monomolecules 151, a small amount of unreacted compounds (optional) for forming the self-assembled monomolecules 151, and a trace amount of solvents (optional).

Referring to FIG. 2, a surface (e.g., an upper surface) of the emission layer 140 may include a first region filled with the quantum dots 141 and a second region not filled with the quantum dots 141 (a quadrangle marked with a dotted line in FIG. 2). In other words, the upper surface of the emission layer 140 may have upper and lower and/or left and right steps such as the second region depending on a size deviation of the quantum dots 141, a thickness of the emission layer 140, and the like.

The second region is a space working as a leakage path of electrons while the device is driven, and when the emission layer 140 is a cluster layer formed of a plurality of the quantum dots 141, which have a predetermined volume, as shown in FIG. 2, the second region may not be completely removed from the emission layer 140. However, for the electroluminescent device 10 according to an embodiment, as shown in FIG. 2, may fill at least a portion of the second region with the self-assembled monomolecular layer 150. For example, the self-assembled monomolecular layer 150 may fill the whole of the second region with the plurality of self-assembled monomolecules 151.

In this way, when the self-assembled monomolecular layer 150 fills at least a portion of the second region, the electron/hole leakage path of the upper surface of the emission layer 140 may be removed or minimized. Accordingly, excitons generated from the emission layer 140 may be prevented or be minimal released through the electron/hole leakage path and thus not light-emitted and quenched. Accordingly, light emission and life-span characteristics of the electroluminescent device 10 may be improved by increasing recombination of the electrons with holes in the emission layer 140 (electron-hole recombination).

The electroluminescent device 10 according to an embodiment may easily balance electrons-holes of the emission layer 140, as the second region is reduced/removed by using the self-assembled monomolecular layer 150. Specifically, the self-assembled monomolecular layer 150 may suppress excessive injection of the elections from the electron transport layer 160 and in addition, block a hole leakage of the emission layer 140 and reinforce hole injection characteristics. Accordingly, the electroluminescent device 10 according to an embodiment may block the electron/hole leakage path of the emission layer 140 through the self-assembled monomolecular layer 150 and in addition, improve the electron-hole balance and thus improve light emission and life-span characteristics.

Figure 3:
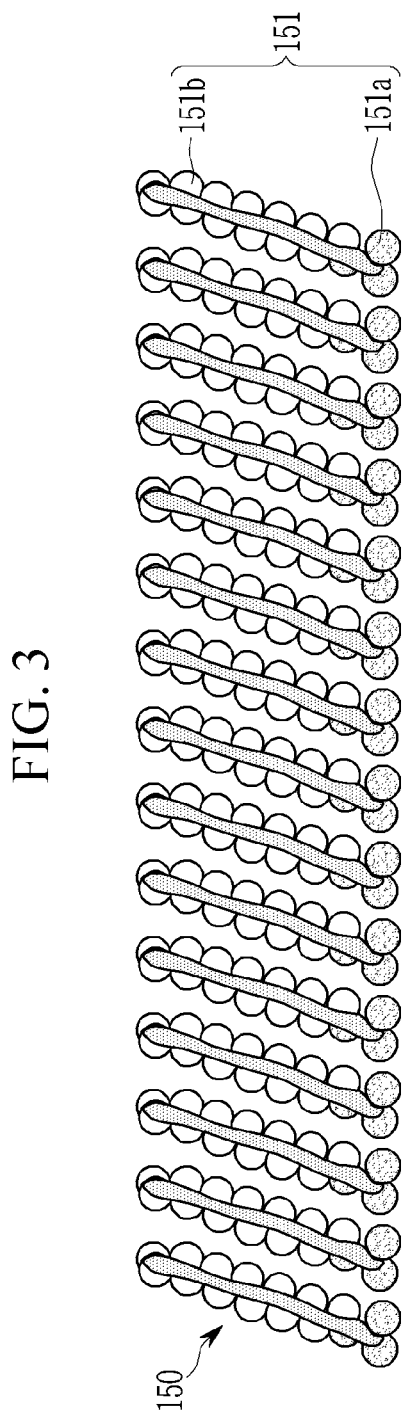
FIG. 3 is a schematic view illustrating an enlarged portion of a self-assembled monomolecular layer of an electroluminescent device according to one embodiment.

FIG. 3 is a schematic view illustrating an enlarged portion of a self-assembled monomolecular layer of an electroluminescent device according to one embodiment.

Referring to FIG. 3, the self-assembled monomolecules 151 may have a first terminal end 151a and a second terminal end 151b. The first terminal end 151a may be disposed closer to the surface (e.g., the upper surface) of the emission layer 140, and the second terminal end 151b may be disposed farther from the surface of the emission layer 140 than the first terminal end 151a.

In an embodiment, the self-assembled monomolecules 151 may be attached to the surfaces of the quantum dots 141. Specifically, the first terminal end 151a of the self-assembled monomolecules 151 may form a bond including a chemical bond, an electrostatic attraction bond (a dispersion force, i.e., a van der Waals bond), or a combination thereof with the surface of the quantum dots 141.

The first terminal end 151a may include a functional group having a relatively strong chemical bond force and/or dispersion force with metal elements constituting the quantum dots 141. Examples of the functional group included in the first terminal end 151a may include carboxylate (—COO$^-$), phosphoryl (—PO$_2^{2-}$), or a combination thereof.

Meanwhile, the second terminal end 151b may include a functional group having a weaker chemical bond force and/or dispersion force with the surfaces of the quantum dots 141 than the first terminal end 151a. Alternatively, the second terminal 151b may be spaced apart from a surface of the quantum dots 141 without forming a bond due to chemical bonding and/or electrostatic attraction with a surface of the electron transport layer 160.

In an embodiment, the second terminal end 151b includes an electron donating functional group (electron donating group), a hole blocking functional group (hole blocking group), an insulating functional group (insulating group), or a combination thereof. In an embodiment, the second terminal end 151b may have a functional group having insulation properties.

The type of the functional group included in the second terminal end 151b may vary depending on materials of the self-assembled monomolecule 151 and the types of (hydrophobic) ligands attached to the quantum dots 141.

Specifically, the self-assembled monomolecules 151 according to an embodiment may be derived from a compound represented by Chemical Formula 1.

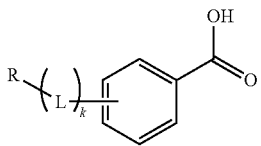

Chemical Formula 1

In Chemical Formula 1,
L is —C($R_a$)($R_b$)—, —O—, —S—, —Se—, —N($R_c$)—, —P($R_d$)—, —COO—, —CO—, or a combination thereof, and $R_a$, $R_b$, $R_c$, and $R_d$ are independently hydrogen, a halogen, a substituted or unsubstituted C1 to C20 alkyl group, a substituted or unsubstituted C1 to C20 aryl group, or a substituted or unsubstituted C1 to C20 heteroaryl group, R is hydrogen, a halogen, a substituted or unsubstituted C1 to C20 alkyl group, a substituted or unsubstituted C1 to C20 cycloalkyl group, a substituted or unsubstituted C1 to C20 aryl group, or a substituted or unsubstituted C1 to C20 heteroaryl group, and k is an integer of 0 to 4.

More specifically, the self-assembled monomolecule 151 may be derived from a compound represented by Chemical Formula 2.

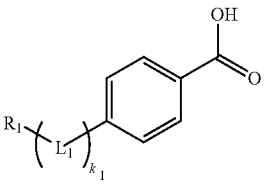

Chemical Formula 2

In Chemical Formula 2,
$L_1$ is —C($R_a$)($R_b$)—, —O—, or a combination thereof, and $R_a$, $R_b$, $R_c$, and $R_d$ are independently hydrogen, a halogen, a substituted or unsubstituted C1 to C20 alkyl group, a substituted or unsubstituted C1 to C20 aryl group, or a substituted or unsubstituted C1 to C20 heteroaryl group, $R_1$ is hydrogen, a halogen, or a substituted or unsubstituted C1 to C20 alkyl group, and $k_1$ is 0 or 1.

Figure 4:
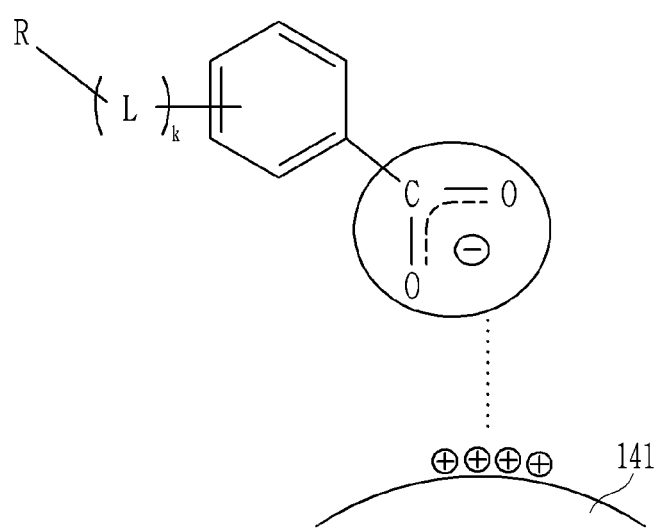
FIG. 4 is a schematic view illustrating an interaction between quantum dots and self-assembled monomolecules in an electroluminescent device according to an embodiment.

FIG. 4 is a schematic view illustrating an interaction between quantum dots and self-assembled monomolecules in an electroluminescent device according to an embodiment.

Referring to FIG. 4, the self-assembled monomolecules have a carboxylate as the first terminal end, which may interact with the surface of the quantum dots 141. The interactions may be chemical interactions (i.e., chemical bonds), static electrostatic interactions (i.e., van der Waals bonds), or may be a combination thereof.

In an embodiment, each of the compound represented by Chemical Formula 1, the self-assembled monomolecular layer 150, and the self-assembled monomolecules 151 may exhibit polarity. Accordingly, the self-assembled monomolecular layer 150 may be formed by applying a solution obtained by dispersing the aforementioned compound represented by Chemical Formula 1 in a polar solvent, on the emission layer 140 and drying the resultant.

Examples of compounds that may be used as the polar solvent may include water, ethanol, methanol, propanol, butanol, acetic acid, ethylene glycol, diethylene glycol, glycerine, isopropyl alcohol, 2-methoxy ethanol, acetone, acetonitrile, or a combination thereof.

When the compound represented by Chemical Formula 1, the self-assembled monomolecules 151, and the self-assembled monomolecular layer 150 have improved solubility for the aforementioned polar solvent, the self-assembled monomolecular layer 150 is easy to form on the surface of the emission layer 140. In other words, the emission layer 140 is hydrophobic due to the hydrophobic ligand, but the self-assembled monomolecular layer 150 is polar and thus has excellent solubility for the polar solvent as described above, and accordingly, even though the self-assembled monomolecular layer 150 is formed directly on the emission layer 140 by using the solution process, the emission layer 140 may be prevented or minimized from surface damage due to the solvent.

On the other hand, a length from the first terminal end 151a to the second terminal end 151b, that is, a length of the self-assembled monomolecule 151 may vary depending on a kind of the self-assembled monomolecule 151, chemical properties of the first and second terminal ends 151a and 151b, and the like but may be for example in a range of greater than or equal to about 0.1 nm, for example, greater than or equal to about 0.5 nm, for example greater than or equal to about 1 nm, for example, greater than or equal to about 2 nm, or for example, greater than or equal to about 3 nm and for example, less than or equal to about 15 nm, or less than or equal to about 10 nm.

When the length of the self-assembled monomolecule 151 is less than about 1 nm, even though the self-assembled monomolecule 151 is formed to fill the second region of the emission layer 140, an effect thereof may rarely be realized. On the contrary, when the length of the self-assembled monomolecule 151 is greater than about 15 nm, the emission layer 140 may hardly accomplish the electron-hole balance due to insulation properties of the self-assembled monomolecules 151. In this way, since the electroluminescent device 10 according to an embodiment may minimize or remove a void and/or a crack on a surface of the emission layer 140 by using the self-assembled monomolecular layer 150, the electroluminescent device 10 may exhibit improved light emission and life-span characteristics.

In an embodiment, the electron transport layer 160 is directly present between the emission layer 140 and the second electrode 160 and specifically, directly on the self-assembled monomolecular layer 150 and thus plays a role of transporting electrons to the emission layer 140.

In an embodiment, a thickness of the electron transport layer 160 may be variously changed in consideration of materials and thicknesses of the hole injection layer 120, the hole transport layer 130, and the emission layer 140 inside the device and/or a whole electron-hole balance of the device depending on presence of the self-assembled monomolecular layer 150 but may be for example, in a range of greater than or equal to about 10 nm, greater than or equal to about 15 nm, or greater than or equal to about 20 nm and for example, less than or equal to about 100 nm, less than or equal to about 90 nm, less than or equal to about 80 nm, less than or equal to about 70 nm, less than or equal to about 60 nm, less than or equal to about 50 nm, or less than or equal to about 40 nm, and for example, about 10 nm to about 100 nm, about 10 nm to about 60 nm, about 10 nm to about 50 nm, about 10 mm to about 40 nm, or about 15 nm to about 40 nm.

When the electron transport layer 160 has a thickness out of the above range, the void, the crack, and the like on the electron transport layer 160 have a more influence on electron transport properties and thus greatly deteriorate device characteristics and hardly accomplish an electron-hole balance with the other constituent elements in the electroluminescent device 10.

In an embodiment, the electron transport layer 160 may be formed of an electron-transporting material not emitting light by an electric field and thus not internally quenching electrons.

Meanwhile, the electron transport layer 160 may include inorganic material nanoparticles or may be an organic layer formed by deposition. For example, the electron transport layer 160 may include inorganic material nanoparticles, a quinolone-based compound, a triazine-based compound, a quinoline-based compound, a triazole-based compound, a naphthalene-based compound, or a combination thereof.

In an embodiment, the electron transport layer 160 may include inorganic material nanoparticles. The inorganic material nanoparticles may impart electron transport properties to the electron transport layer 160 and do not exhibit light emitting properties. Examples of the inorganic material nanoparticles may be salts of metals including zinc (Zn), magnesium (Mg), tin (Sn), zirconium (Zr), titanium (Ti), aluminum (Al), or a combination thereof.

In an embodiment, the electron transport layer 160 may include a plurality of inorganic material nanoparticles. In an embodiment, the electron transport layer 160 may include a cluster layer consisting of a plurality of inorganic material nanoparticles. In an embodiment, the electron transport layer 160 may be a cluster layer consisting of a plurality of inorganic material nanoparticles.

Meanwhile, an electron injection layer (EIL) to facilitate the injection of electrons and/or a hole blocking layer to prevent the movement of holes may be further formed between the electron transport layer 160 and the second electrode 160.

Thicknesses of the electron injection layer and the hole blocking layer may be selected appropriately. For example, each thickness of the layers may be greater than or equal to about 1 nm or less than or equal to about 500, but is not limited thereto. The electron injection layer may be an organic layer formed by deposition.

The electron injection layer may include for example at least one of 1,4,5,8-naphthalene-tetracarboxylic dianhydride (NTCDA), bathocuproine (BCP), tris[3-(3-pyridyl)-mesityl]borane (3TPYMB), LiF, $Alq_3$, $Gaq_3$, $Inq_3$, $Znq_2$, $Zn(BTZ)_2$, $BeBq_2$, ET204 (8-(4-(4,6-di(naphthalen-2-yl)-1,3,5-triazin-2-yl)phenyl)quinolone), 8-hydroxyquinolinato lithium (Liq), n-type metal oxide (e.g., ZnO, $HfO_2$, etc.), Bphen, or a combination thereof, but is not limited thereto.

The hole blocking layer may include for example at least one of 1,4,5,8-naphthalene-tetracarboxylic dianhydride (NTCDA), bathocuproine (BCP), tris[3-(3-pyridyl)-mesityl]borane (3TPYMB), LiF, $Alq_3$, $Gaq_3$, $Inq_3$, $Znq_2$, $Zn(BTZ)_2$, $BeBq_2$, or a combination thereof, but is not limited thereto.

A light emitting direction of the electroluminescent device 10 according to an embodiment is not particularly limited. That is, the electroluminescent device 10 according to an embodiment may have any one driving method such as front emission, bottom emission, or dual-side emission.

As such, the electroluminescent device 10 according to an embodiment has a stacking structure in which the self-assembled monomolecular layer 150 is formed between the emission layer 140 and the electron transport layer 160, specifically an upper surface of the emission layer 140. Accordingly, the electroluminescent device 10 according to an embodiment may suppress excessive electron injection through the self-assembled monomolecular layer 150, and may improve light emitting and life-span characteristics of the device by preventing or minimizing leakage currents.

Hereinafter, a display device including the aforementioned electroluminescent device 10 is described.

A display device according to an embodiment includes a substrate, a driving circuit formed on the substrate, and a first electroluminescent device, a second electroluminescent device, and a third electroluminescent device spaced apart from each other in a predetermined interval and disposed on the driving circuit.

The first to third electroluminescent devices have the same structure as the aforementioned electroluminescent device 10, though the wavelengths of the lights emitted from each quantum dots may be different from each other.

In an embodiment, the first electroluminescent device is a red device emitting red light, the second electroluminescent device is a green device emitting green light, and the third electroluminescent device is a blue device emitting blue light. In other words, the first to third electroluminescent devices may be pixels expressing red, green, and blue, respectively, in the display device.

However, an embodiment is not necessarily limited thereto, but the first to third electroluminescent devices may respectively express magenta, yellow, cyan, or may express other colors.

One of the first to third electroluminescent devices may be the aforementioned electroluminescent device 10. In this case, the third electroluminescent device displaying at least blue may be desirably the aforementioned electroluminescent device 10.

In the display device according to an embodiment, a hole injection layer, a hole transporting layer, an electron transporting layer, an electron injection layer, and a hole blocking layer except an emission layer of each pixel may be integrated to form a common layer. However, an embodiment is not limited thereto. A hole injection layer, a hole transporting layer, an electron transporting layer, an electron injection layer, and a hole blocking layer may be independently formed in each pixel of the display device, or at least one of a hole injection layer, a hole transporting layer, an electron transporting layer, an electron injection layer, and a hole blocking layer may form a common layer and remaining layers may form a separate independent layer.

The substrate may be a transparent insulating substrate or may be made of a ductile material. The substrate may include glass or a polymer material in a film having a glass transition temperature (Tg) of greater than about 150° C. For example, it includes a COC (cycloolefin copolymer) or COP (cycloolefin polymer) based material. All the aforementioned first to third electroluminescent devices are formed on the substrate. That is, a substrate of the display device according to an embodiment provides a common layer.

The driving circuit is disposed on the substrate and is independently connected to each of the first to third electroluminescent devices. The driving circuit may include at least one line including a scan line, a data line, a driving power source line, a common power source line, and the like, at least two of thin film transistors (TFT) connected to the wire and corresponding to one organic light emitting diode, and at least one capacitor, or the like. The driving circuit may have a variety of the known structures.

As described above, the display device according to an embodiment may prevent internal leakage current of the electroluminescent device and improve luminous efficiency and life-span characteristics. Therefore, the display device according to an embodiment may exhibit excellent light emitting characteristics even at low power.

Hereinafter, the embodiments are illustrated in more detail with reference to examples. However, these examples are exemplary, and the present disclosure is not limited thereto.

EXAMPLES

Verification Example 1

A 20 nm-thick (red) emission layer is formed by preparing a composition for an emission layer by dispersing InP/ZnSe/ZnS core-shell quantum dots adhered with oleate as a hydrophobic ligand (an average particle diameter: 18 nm, a peak emission wavelength: 630 nm) in octane and then, coating the composition on a glass substrate and heating it at 80° C.

On the emission layer, a composition for a self-assembled monomolecular layer is prepared by dissolving 5 millimoles (mmol) of a compound represented by Chemical Formula 2-1 in 1 milliliter (mL) of ethanol and then, spin-coated at 4000 rpm and dried at 80° C. to form a self-assembled monomolecular layer having a thickness of about 1 nanometer (nm) to 5 nm and thus obtain a bilayered (emission layer/self-assembled monomolecular layer) thin film according to Verification Example 1.

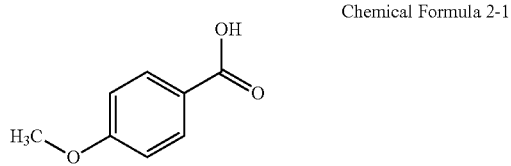

Chemical Formula 2-1

Comparative Verification Example 1

A monolayer (emission layer) thin film according to Comparative Verification Example 1 is formed by preparing a composition for an emission layer dispersing an InP/ZnSe/ZnS core-shell quantum dots adhered with oleate as a hydrophobic ligand (an average particle diameter: 18 nm, a peak emission wavelength: 630 nm) in octane and then, coating the composition on a glass substrate and heating it at 80° C. to form an emission layer having a thickness of 20 nm.

Comparative Verification Example 2

A monolayer (self-assembled monomolecular layer) thin film according to Comparative Verification Example 2 is obtained by forming a self-assembled monomolecular layer having a thickness of about 1 nm to 5 nm on the emission layer by using a composition for a self-assembled monomolecular layer prepared by dissolving 5 mmol of a compound represented by Chemical Formula 2-1 in 1 mL of ethanol and then, spin-coating the composition at 4000 rpm and drying it at 80° C.

Evaluation 1: Whether Self-Assembled Monomolecules are Attached to Quantum Dots or not Fourier transform infrared spectroscopy (FT-IR) of the thin films according to Verification Example 1 and Comparative Verification Examples 1 and 2 is performed and the results are shown in FIG. 5.

Figure 5:
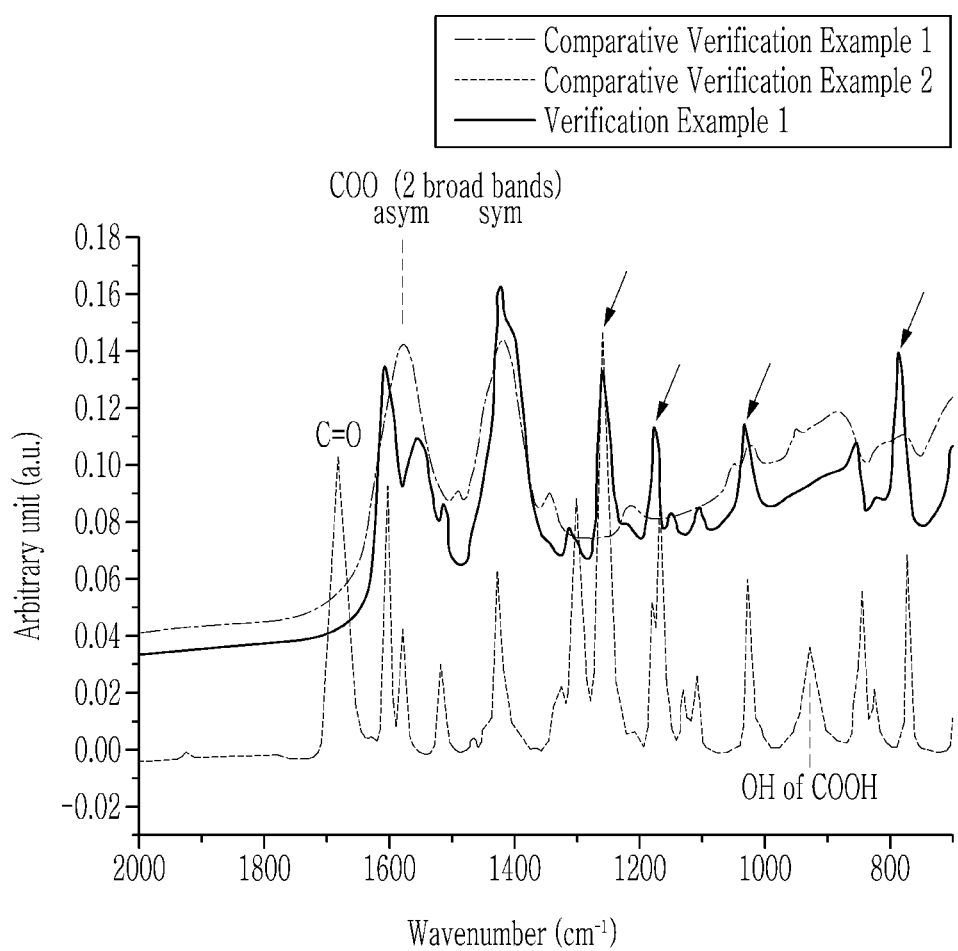
FIG. 5 is a graph showing Fourier transform infrared spectroscopy (FT-IR) results of thin films according to Verification Example 1 and Comparative Verification Examples 1 to 2.

FIG. 5 is a graph showing Fourier transform infrared spectroscopy (FT-IR) results of thin films according to Verification Example 1 and Comparative Verification Examples 1 to 2.

Referring to FIG. 5, the thin film according to Verification Example 1 exhibits a hydroxy group (—OH) decrease and a carboxylate (—COO—) increase compared with the thin films according to Comparative Verification Examples 1 to 2. Accordingly, referring to the result of FIG. 5, when the self-assembled monomolecular layer is formed by using the compound represented by Chemical Formula 2-1 on the emission layer, a carboxyl group (—COOH) moiety of Chemical Formula 2-1 is transformed into carboxylate (—COO—) and thus interacts with the surface of the quantum dot.

Verification Example 2

A 30 nm-thick hole injection layer is formed by surface-treating a glass substrate deposited with indium tin oxide (ITO), a first electrode (an anode), with a UV-ozone for 15 minutes and then, spin-coating a PEDOT:PSS solution (HOMO energy level: −5.35 eV, H. C. Starks Inc.) and heat-treating it at 150° C. for 30 minutes under a nitrogen atmosphere.

Subsequently, on the hole injection layer, a 25 nm-thick first hole transport layer is formed by spin-coating a solution prepared by dissolving poly[(9,9-dioctylfluorenyl-2,7-diyl-co(4,4'-(N-4-butylphenyl)diphenylamine] (TFB, HOMO energy level: −5.56 eV, LUMO energy level: −2.69 eV, Sumitomo Corp.) in o-xylene and then, heat-treating it at 150° C. for 30 minutes.

Subsequently, a 20 nm-thick (red) emission layer is formed by preparing a composition for an emission layer by dispersing InP/ZnSe/ZnS core-shell quantum dots adhered with oleate as a hydrophobic ligand (an average particle diameter: 18 nm, a peak emission wavelength: 630 nm) in octane to and then, coating the composition and drying it at 80° C.

Then, on the emission layer, a self-assembled monomolecular layer having a thickness of about 1 nm to 5 nm is formed by spin-coating a composition for a self-assembled monomolecular layer prepared by dissolving 5 mmol of a compound represented by Chemical Formula 2-1 in 1 mL of ethanol at 4000 rpm and then, drying the composition at 80° C.

Subsequently, on the self-assembled monomolecular layer, a bicarbazole-based compound (GSH0137, Samsung SDI Co., Ltd.) is deposited to form a 36 nm-thick second hole transport layer.

On the second hole transport layer, 1,4,5,8,9,11-Hexaazatriphenylenehexacarbonitrile (HAT-CN) is deposited to form a 10 nm-thick hole injection layer.

Subsequently, on the hole injection layer, silver is vacuum-deposited 100 nm thick and thus form a second electrode, resultantly manufacturing HOD (Hole Only Device) according to Verification Example 2 (ITO/PEDOT:PSS/TFB/Red QD/self-assembled monomolecular layer (Chemical Formula 2-1)/GSH0137/HAT-CN/Ag).

Comparative Verification Example 3

HOD (Hole Only Device) (ITO/PEDOT:PSS/TFB/Red QD/GSH0137/HAT-CN/Ag) according to Comparative Verification Example 3 is manufactured according to the same method as Verification Example 2 except that the second hole transport layer is formed on the emission layer without forming the self-assembled monomolecular layer.

Evaluation 2: Hole Transport Properties of Devices (HOD) Including Self-Assembled Monomolecular Layers Voltage-current density of the HODs according to Verification Example 2 and Comparative Verification Example 3 is measured, and the results are shown in Table 1 and FIG. 6.

TABLE 1

|  | Verification Example 2 | Comparative Verification Example 3 |
| --- | --- | --- |
| Current density @ 8 V (mA/cm$^2$) | 0.5428 | 0.0294 |
| Current density @ 12 V (mA/cm$^2$) | 4.2129 | 0.1769 |

Figure 6:
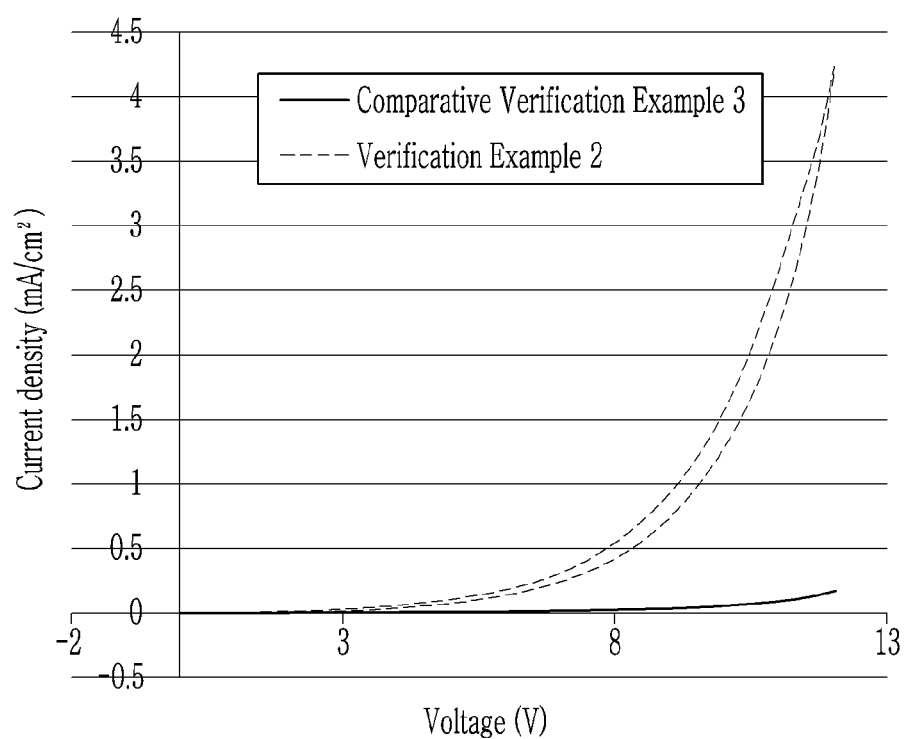
FIG. 6 is a graph showing the voltage-current density of HOD (Hole Only Device) according to Verification Example 2 and Comparative Verification Example 3.

FIG. 6 is a graph showing the voltage-current density of HOD according to Verification Example 2 and Comparative Verification Example 3, Referring to Table 1 and FIG. 6, Verification Example 2 including the self-assembled monomolecular layer exhibits a significant increase in current density depending on voltage and specifically, about 18.5 times increased current density at 8 V and about 23.8 times increased current density at 12 V compared with Comparative Verification Example 3 having no self-assembled monomolecular layer.

Accordingly, referring to the results of Table 1 and FIG. 6, as for Verification Example 2 including the self-assembled monomolecular layer, the self-assembled monomolecular layer may improve hole injection and thus hole transportation of a device.

Verification Example 3

A 20 nm-thick first electron transport layer is performed by surface-treating a glass substrate deposited with ITO, a first electrode (an anode), with an UV-ozone for 15 minutes and then, spin-coating a solution for an electron transport layer, which is prepared by dispersing ZnMgO (an average particle diameter: 2 nm to 5 nm) in ethanol, and heat-treating it at 80° C. for 30 minutes.

Subsequently, a composition for a emission layer, which is prepared by dispersing InP/ZnSe/ZnS core-shell quantum dots adhered with oleate as a hydrophobic ligand (an average particle diameter: 18 nm, a peak emission wavelength: 630 nm) in octane is coated and then, heated at 80° C. to form a 20 nm-thick (red) emission layer.

On the emission layer, a composition for a self-assembled monomolecular layer, which is prepared by dissolving 5 mmol of a compound represented by Chemical Formula 2-1 in 1 mL of ethanol, is spin-coated at 4000 rpm and then, dried at 80° C. to form a self-assembled monomolecular layer having a thickness of about 1 nm to 5 nm.

On the self-assembled monomolecular layer, a 20 nm-thick second electron transport layer is formed by spin-coating a solution for an electron transport layer, which is prepared by dispersing ZnMgO (an average particle diameter: 2 nm to 5 nm) in ethanol and then, heat-treating it at 80° C. for 30 minutes.

Subsequently, on the second electron transport layer, aluminum is vacuum-deposited to be 100 nm thick and thus form a second electrode, resultantly manufacturing EOD (Electron Only Device) according to Verification Example 3 (ITO/ZnMgO/Red QD/self-assembled monomolecular layer (using Chemical Formula 2-1)/ZnMgO/Al).

Comparative Verification Example 4

EOD (Electron Only Device) (ITO/ZnMgO/Red QD/ZnMgO/Al) according to Comparative Verification Example 4 is manufactured according to the same method as Verification Example 3 except that the second electron transport layer is formed directly on the emission layer without forming the self-assembled monomolecular layer.

Evaluation 3: Electron Transport Properties of Device (EOD) Including Self-Assembled Monomolecular Layer Voltage-current density of EOD's of Verification Example 3 and Comparative Verification Example 4 is measured, and the results are shown in Table 2 and FIG. 7.

TABLE 2

|  | Verification Example 3 | Comparative Verification Example 4 |
| --- | --- | --- |
| Current density @ 5 V (mA/cm$^2$) | 172.628 | 319.578 |

Figure 7:
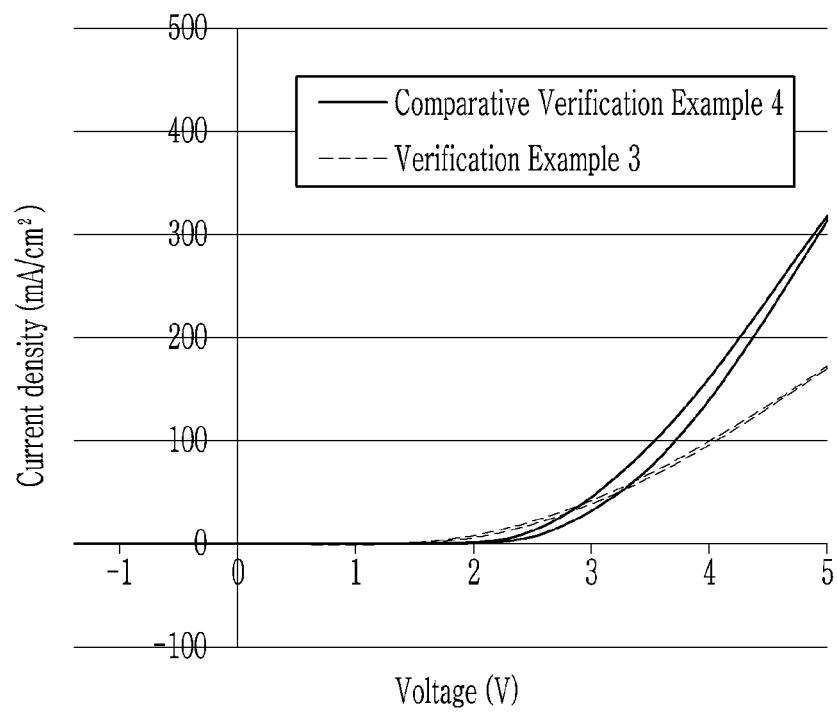
FIG. 7 is a graph showing the voltage-current density of EOD (Electron Only Device) according to Verification Example 3 and Comparative Verification Example 4.

FIG. 7 is a graph showing the voltage-current density of EOD according to Verification Example 3 and Comparative Verification Example 4.

Referring to Table 2 and FIG. 7, Verification Example 3 including the self-assembled monomolecular layer exhibits a current density decrease depending on a voltage and specifically, about a 50% decrease in current density at 5 V compared with Comparative Verification Example 4 including no self-assembled monomolecular layer.

Accordingly, referring to the results of Table 2 and FIG. 7, as for Verification Example 3 including the self-assembled monomolecular layer, the self-assembled monomolecular layer may suppress excessive injection of electrons and easily adjust an electron-hole balance and simultaneously, prevent degradation of a device by blocking extra electrons.

Example 1

A 30 nm-thick hole injection layer is formed by surface-treating a glass substrate deposited with ITO, a first electrode (an anode), with an UV-ozone for 15 minutes and then, spin-coating a PEDOT:PSS solution (an HOMO energy level: −5.35 eV, H.C. Starks Inc.) and heat-treating it at 150° C. for 30 minutes under a nitrogen atmosphere.

On the hole injection layer, a 25 nm-thick hole transport layer is formed by spin-coating a solution prepared by dissolving poly[(9,9-dioctylfluorenyl)-2,7-diyl-co(4,4'-(N-4-butylphenyl)diphenylamine)] (TFB, an HOMO energy level: −5.56 eV, a LUMO energy level: −2.69 eV, Sumitomo Corp.) in o-xylene and then, heat-treating it at 150° C. for 30 minutes.

Subsequently, a 20 nm-thick (red) emission layer is formed by coating a composition for an emission layer, which is prepared by dispersing InP/ZnSe/ZnS core-shell quantum dots adhered with oleate as a hydrophobic ligand (an average particle diameter: 18 nm, a peak emission wavelength: 630 nm) in octane and then, heating it at 80° C.

On the emission layer, a composition for a self-assembled monomolecular layer, which is prepared by dissolving 5 mmol of a compound represented by Chemical Formula 2-1 in 1 mL of ethanol, is spin-coated at 4000 rpm and then, dried at 80° C. to form a self-assembled monomolecular layer having a thickness of about 1 nm to 5 nm.

On the self-assembled monomolecular layer, a 30 nm-thick electron transport layer is formed by spin-coating a solution for an electron transport layer, which is prepared by dispersing ZnMgO (an average particle diameter: 2 nm to 5 nm) in ethanol and then, heat-treating it at 80° C. for 30 minutes.

On the electron transport layer, aluminum is vacuum-deposited to be 100 nm thick and thus form a second electrode, resultantly manufacturing an electroluminescent device according to Example 1 (ITO/PEDOT:PSS/TFB/Red QD/self-assembled monomolecular layer (using Chemical Formula 2-1)/ZnMgO/Al).

Comparative Example 1

An electroluminescent device according to Comparative Example 1 (ITO/PEDOT:PSS/TFB/Red QD/ZnMgO/Al) is manufactured according to the same method as Example 1 except that the electron transport layer is formed directly on the emission layer without forming the self-assembled monomolecular layer.

Evaluation 4: Light Emitting and Life-Span Characteristics of (Red) Electroluminescent Devices Light emitting characteristics of the electroluminescent devices according to Example 1 and Comparative Example 1 are measured, and the results are shown in Tables 3A and 3B and FIGS. 8 to 10.

TABLE 3A

|  | Max. EQE (%) | Max. lumin. (cd/m²) | EQE @ 5000 nt (%) | EQE @ 10000 nt (%) | EQE @ 20000 nt (%) | CIE x | CIE y |
| --- | --- | --- | --- | --- | --- | --- | --- |
| Example 1 | 24.6 | 93,960 | 24.4 | 20.9 | 17.4 | 0.6880 | 0.3117 |
| Comp. Ex. 1 | 14.7 | 79,770 | 14.3 | 13.3 | 12.2 | 0.6880 | 0.3119 |

TABLE 3B

|  | Max. (Cd/A) | Drive Voltage @ 5 mA (V) | Lumin. @ 5 mA (Cd/m²) | Drive voltage @ 1000 nits (V) | λ max. (nm) | FWHM (nm) |
| --- | --- | --- | --- | --- | --- | --- |
| Example 1 | 29.5 | 3.0 | 1414 | 2.9 | 630 | 35 |
| Comp. Ex. 1 | 17.8 | 3.3 | 769 | 3.4 | 630 | 34 |

Figure 8:
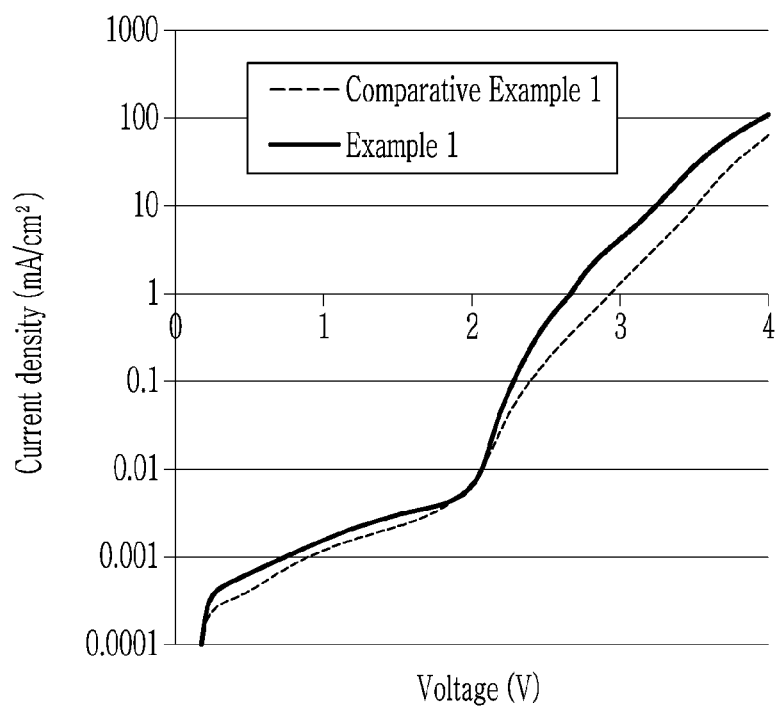
FIGS. 8 to 10 are graphs showing light emitting characteristics of the electroluminescent devices according to Example 1 and Comparative Example 1.
Figure 9:
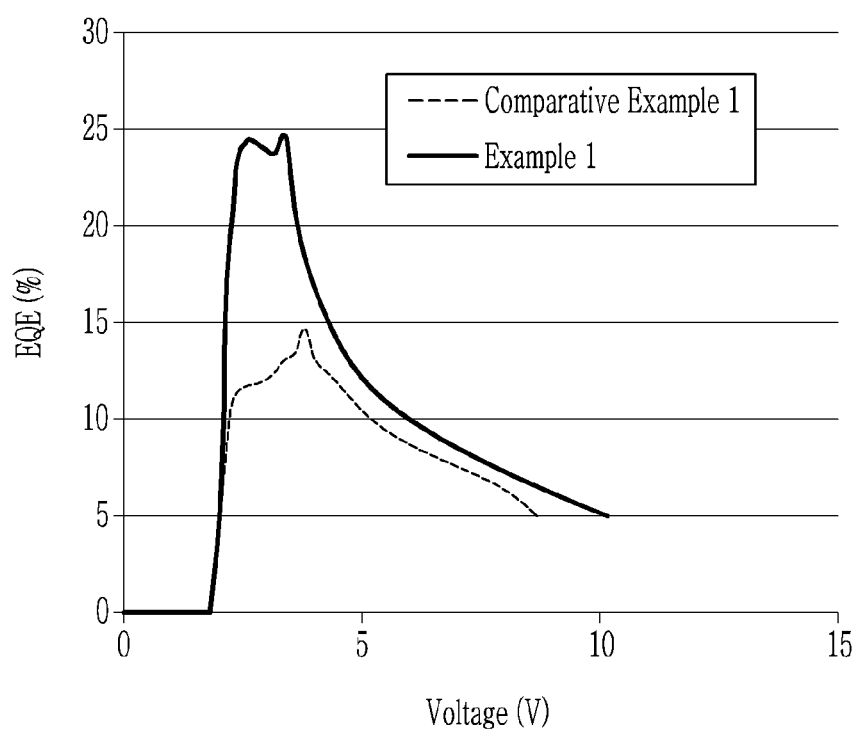
Figure 10:
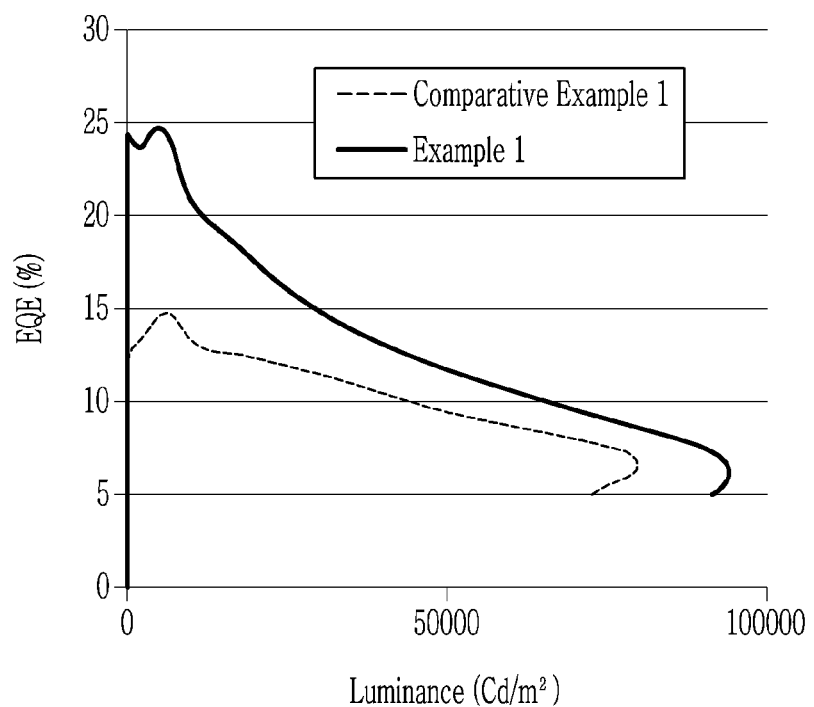

FIGS. 8 to 10 are graphs showing light emitting characteristics of the electroluminescent devices according to Example 1 and Comparative Example 1.

Referring to Tables 3A and 3B and FIGS. 8 to 10, Example 1 including the self-assembled monomolecular layer exhibits high maximum luminance and maximum external quantum efficiency compared with Comparative Example 1 and also high external quantum efficiency at all the voltages (or luminance). In addition, Example 1 turns out to be initially driven at a lower voltage compared with Comparative Example 1 (refer to FIG. 8).

Referring to the results of Tables 3A and 3B and FIGS. 8 to 10, Example 1 including the self-assembled monomolecular layer has an excellent electron-hole balance compared with Comparative Example 1 and in addition, minimizes a leakage current and thus improves driving efficiency.

Figure 11:
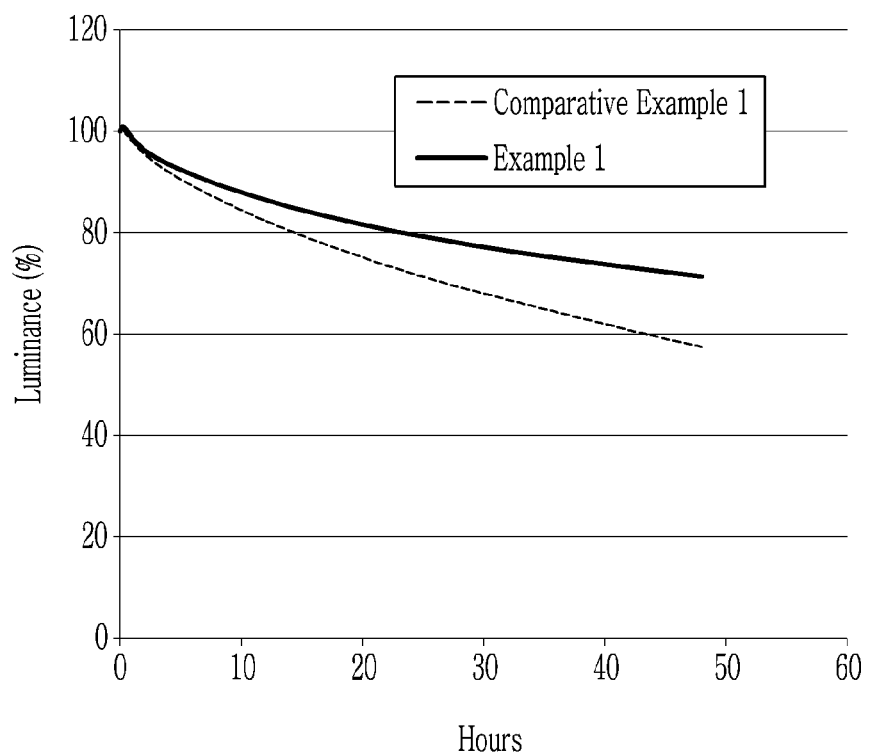
FIGS. 11 to 12 are graphs showing life-span characteristics of the electroluminescent devices according to Example 1 and Comparative Example 1.
Figure 12:
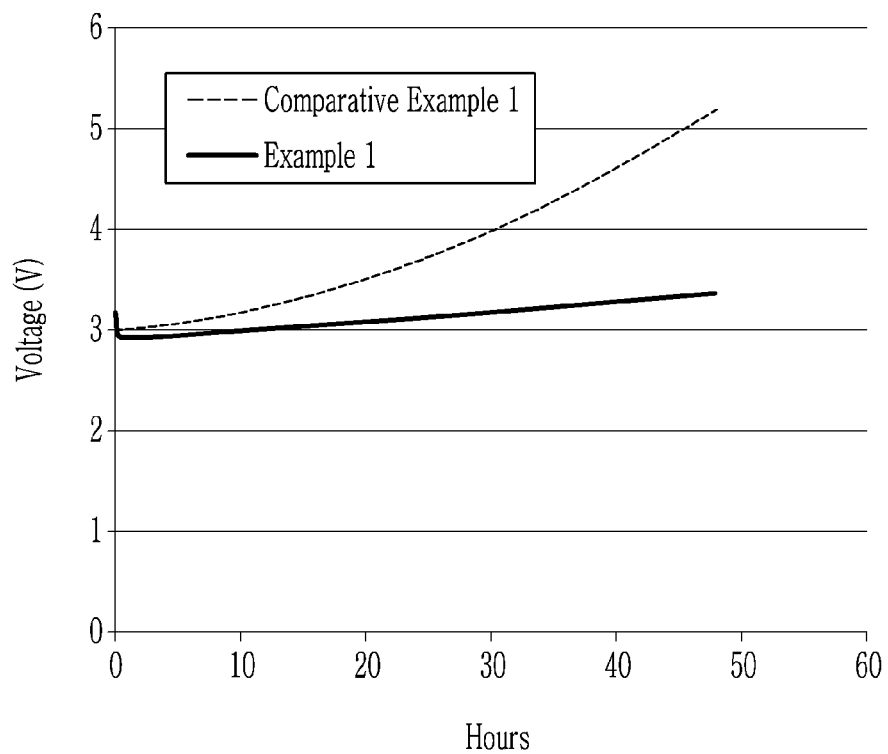

Meanwhile, life-span characteristics of the electroluminescent devices according to Example 1 and Comparative Example 1 are measured, and the results are shown in Table 4 and FIGS. 11 and 12.

TABLE 4

|  | T95 (hr) | T75 (hr) | Current (mA) | Initial P. current (µA) | Initial voltage (V) |
| --- | --- | --- | --- | --- | --- |
| Example 1 | 2.82 | 36.61 | 0.848 | 17.636 | 3.2 |
| Comparative Example 1 | 2.31 | 20.11 | 0.821 | 17.799 | 3.2 |

In Table 4, T95 and T75 respectively indicate each time showing 95% (T95) and 75% (T75) of luminance relative to initial luminance.

In Table 4, an initial P. current is a current obtained by converting emitted light from a device while driven through a light-receiving sensor (a photodiode) and indicates intensity of the emitted light from the device. In other words, the initial P. current is measured by using substantially equivalent light intensity with respect to Example 1 and Comparative Example 1.

FIGS. 11 to 12 are graphs showing life-span characteristics of the electroluminescent devices according to Example 1 and Comparative Example 1.

Referring to Table 4 and FIGS. 11 to 12, Example 1 including the self-assembled monomolecular layer exhibits greatly increased T95 and T75 compared with Comparative Example 1 and almost no voltage change depending on a driving time.

Accordingly, referring to the results of Table 4 and FIGS. 11 to 12, Example 1 including the self-assembled monomolecular layer demonstrate greater stability over time compared with Comparative Example 1 and in addition, minimal device degradation depending on a driving time.

Example 2

An electroluminescent device according to Example 2 (ITO/PEDOT:PSS/TFB/Blue QD/self-assembled monomolecular layer (using Chemical Formula 2-1)/ZnMgO/Al) is manufactured according to the same method as Example 1 except that the (blue) emission layer is formed by using ZnTeSe/ZnSe/ZnS core-shell quantum dots adhered with oleate as a hydrophobic ligand (an average particle diameter: 10 nm to 12 nm, a peak emission wavelength: 452 nm) instead of the InP/ZnSe/ZnS core-shell quantum dots adhered with oleate as a hydrophobic ligand (an average particle diameter: 18 nm, a peak emission wavelength: 630 nm).

Comparative Example 2

An electroluminescent device according to Comparative Example 2 (ITO/PEDOT:PSS/TFB/Blue QD/ZnMgO/Al) is manufactured according to the same method as Example 2 except that the electron transport layer is formed directly on the emission layer without forming the self-assembled monomolecular layer.

Evaluation 5: Light Emitting and Life-Span Characteristics of (Blue) Electroluminescent Device Light emitting characteristics of the electroluminescent devices according to Example 2 and Comparative Example 2 are measured, and the results are shown in Tables 5A and 5B and FIGS. 13 to 15.

TABLE 5A

|  | Max. EQE (%) | Max. lumin. (cd/m2) | EQE @ 5000 nt (%) | EQE @ 10000 nt (%) | EQE @ 20000 nt (%) | CIE x | CIE y |
|---|---|---|---|---|---|---|---|
| Example 2 | 15.3 | 44,700 | 11.3 | 10.5 | 9.4 | 0.1484 | 0.0539 |
| Comp. Ex. 2 | 10.8 | 35,500 | 9.6 | 9.2 | 8.6 | 0.1490 | 0.0506 |

TABLE 5B

|  | Max. (Cd/A) | Drive Voltage @ 5 mA (V) | Lumin. @ 5 mA(Cd/m$^2$) | Drive voltage @ 1000 nt (V) | λ max. (nm) | FWHM (nm) |
|---|---|---|---|---|---|---|
| Example 2 | 8.2 | 3.3 | 308 | 3.5 | 452 | 21 |
| Comp. Ex. 2 | 6.1 | 3.5 | 288 | 3.8 | 452 | 21 |

Figure 13:
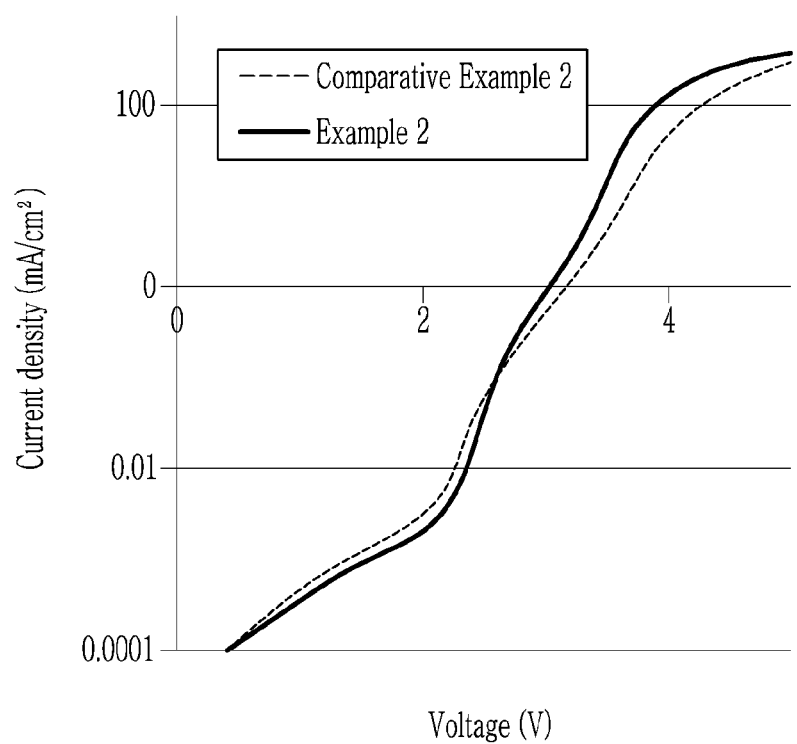
FIGS. 13 to 15 are graphs showing light emitting characteristics of the electroluminescent devices according to Example 2 and Comparative Example 2.
Figure 14:
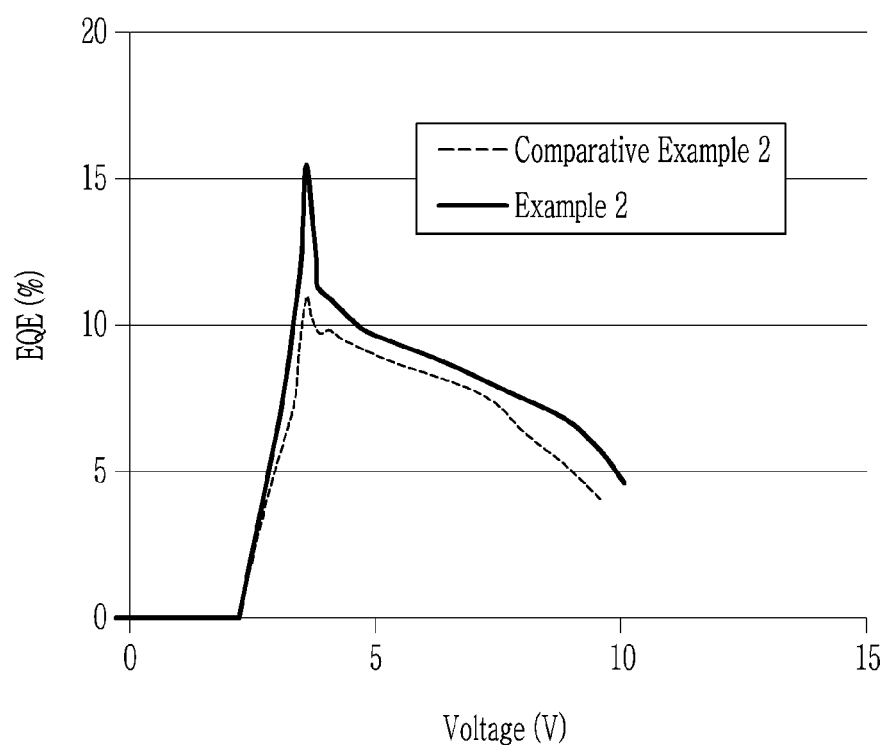
Figure 15:
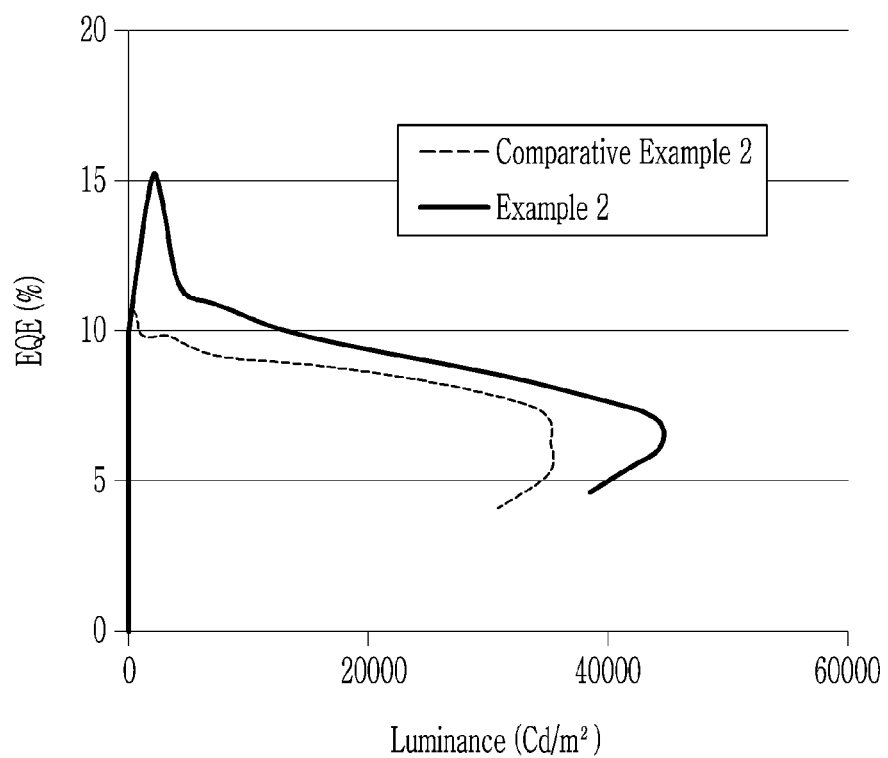

FIGS. 13 to 15 are graphs showing light emitting characteristics of the electroluminescent devices according to Example 2 and Comparative Example 2.

Referring to Tables 5A and 5B and FIGS. 13 to 15, similar to the results of Evaluation 4, even though different quantum dots are used, Example 2 including the self-assembled monomolecular layer exhibits excellent electron-hole balance and improved driving efficiency compared with Comparative Example 2.

Figure 16:
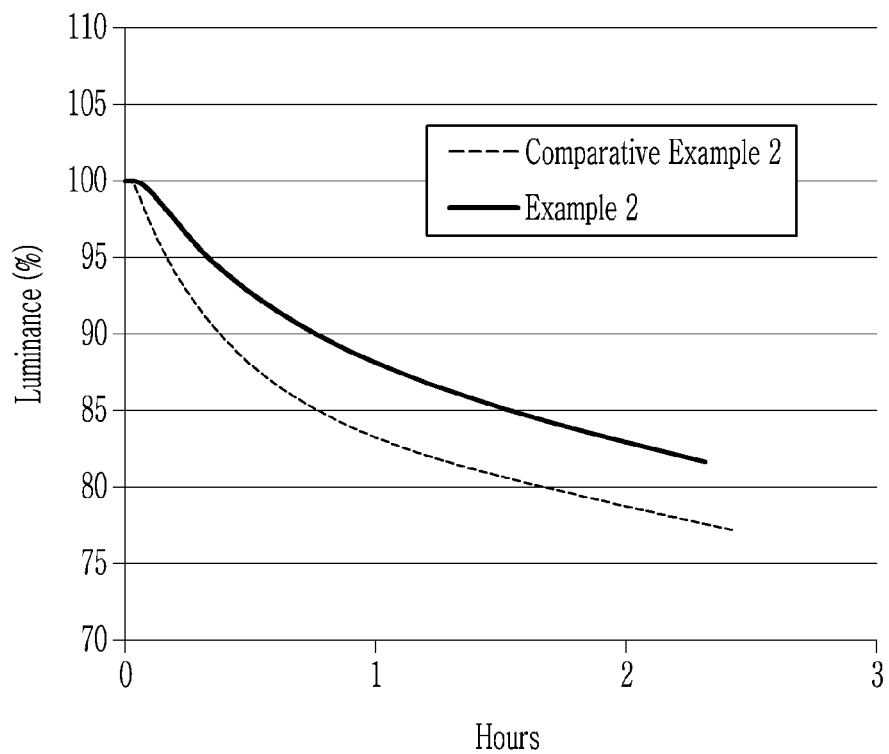
FIGS. 16 to FIG. 17 are graphs showing life-span characteristics of the electroluminescent devices according to Example 2 and Comparative Example 2.
Figure 17:
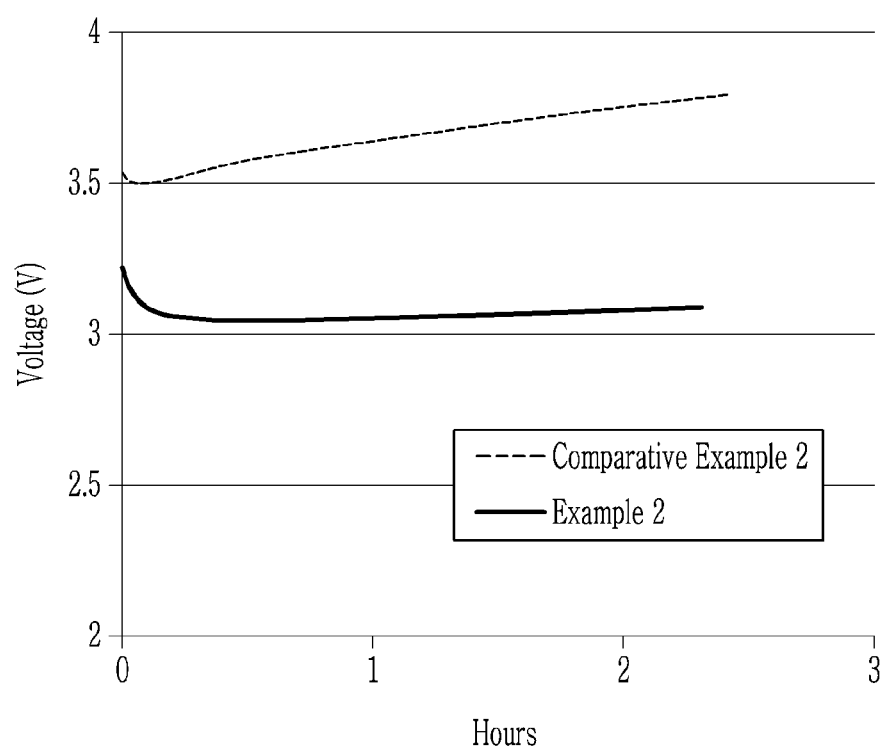

Meanwhile, life-span characteristics of the electroluminescent devices according to Example 2 and Comparative Example 2 are measured, and the results are shown in Table 6 and FIGS. 16 and 17.

TABLE 6

|  | T85 (hr) | Current (mA) | Initial P. current (μA) | Initial voltage (V) |
|---|---|---|---|---|
| Example 2 | 1.5 | 0.240 | 3.024 | 3.5 |
| Comp. Example 2 | 0.78 | 0.235 | 2.915 | 3.2 |

FIGS. 16 to FIG. 17 are graphs showing life-span characteristics of the electroluminescent devices according to Example 2 and Comparative Example 2.

Referring to Table 6 and FIGS. 16 to 17, similar to the results of Evaluation 4, even though different quantum dots are used, Example 2 including the self-assembled monomolecular layer exhibits greater stability over time compared with Comparative Example 2 and in addition, minimal device degradation depending on a driving time.

Example 3

An electroluminescent device according to Example 3 (ITO/PEDOT:PSS/TFB/Red QD/self-assembled monomolecular layer (using Chemical Formula 2-2)/ZnMgO/Al) is manufactured according to the same method as Example 1 except that the self-assembled monomolecular layer is formed by using the compound represented by Chemical Formula 2-2 instead of the compound represented by Chemical Formula 2-1.

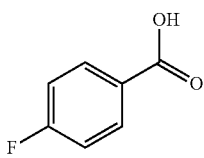

Chemical Formula 2-2

Evaluation 6: Light Emission and Life-Span Characteristics of (Red) Electroluminescent Device when Self-Assembled Monomolecular Layer is Changed Light emitting characteristics of the electroluminescent devices according to Example 3 and Comparative Example 1 are measured, and the results are shown in Tables 7A and 7B and FIGS. 18 to 20.

TABLE 7A

| | Max. EQE (%) | Max. lumin. (cd/m²) | EQE @ 5000 nt (%) | EQE @ 10000 nt (%) | EQE @ 20000 nt (%) | CIE x | CIE y |
|---|---|---|---|---|---|---|---|
| Example 3 | 21.0 | 93030 | 18.7 | 17.5 | 15.8 | 0.6882 | 0.3108 |
| Comp. Ex. 1 | 14.7 | 79770 | 14.3 | 13.3 | 12.2 | 0.6880 | 0.3119 |

TABLE 7B

| | Max. (Cd/A) | Drive Voltage @ 5 mA (V) | Lumin. @ 5 mA (Cd/m²) | Drive voltage @ 1000 nits (V) | λ max. (nm) | FWHM (nm) |
|---|---|---|---|---|---|---|
| Example 3 | 24.0 | 2.8 | 1138 | 2.8 | 630 | 35 |
| Comp. Ex. 1 | 17.8 | 3.3 | 769 | 3.4 | 630 | 34 |

Figure 18:
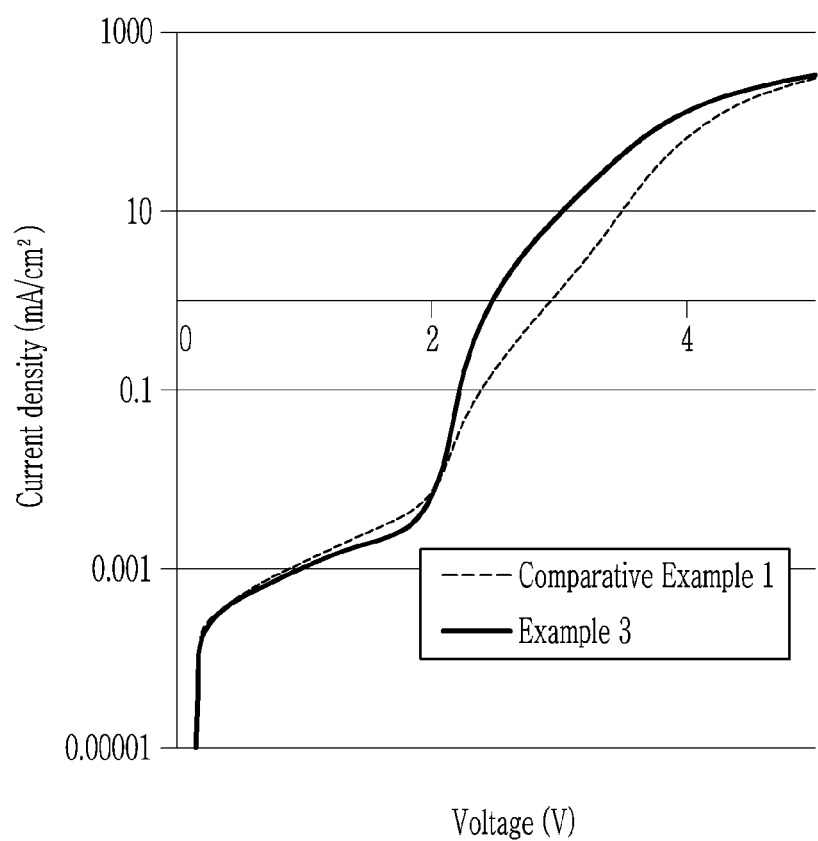
FIGS. 18 to 20 are graphs showing light emitting characteristics of the electroluminescent devices according to Example 3 and Comparative Example 1.
Figure 19:
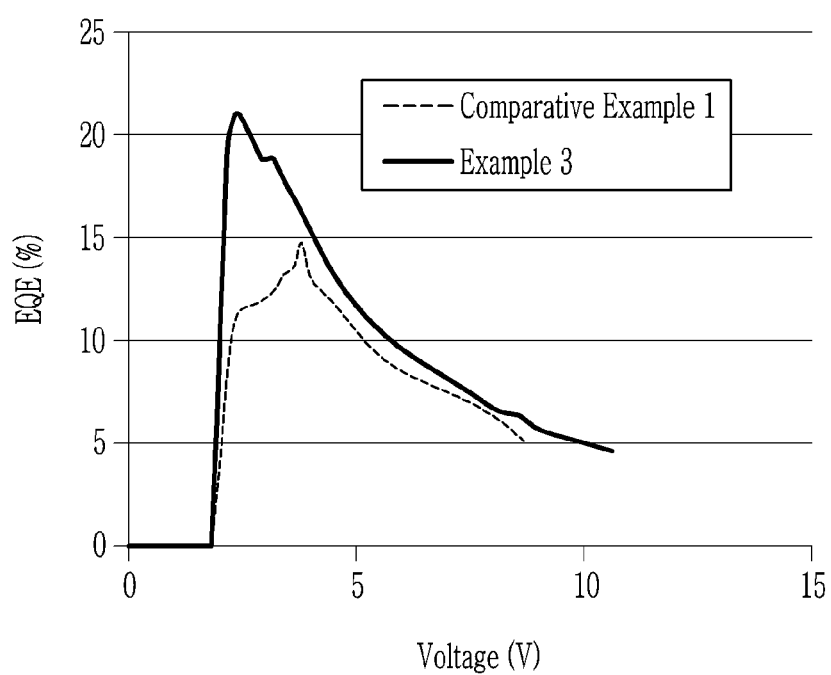
Figure 20:
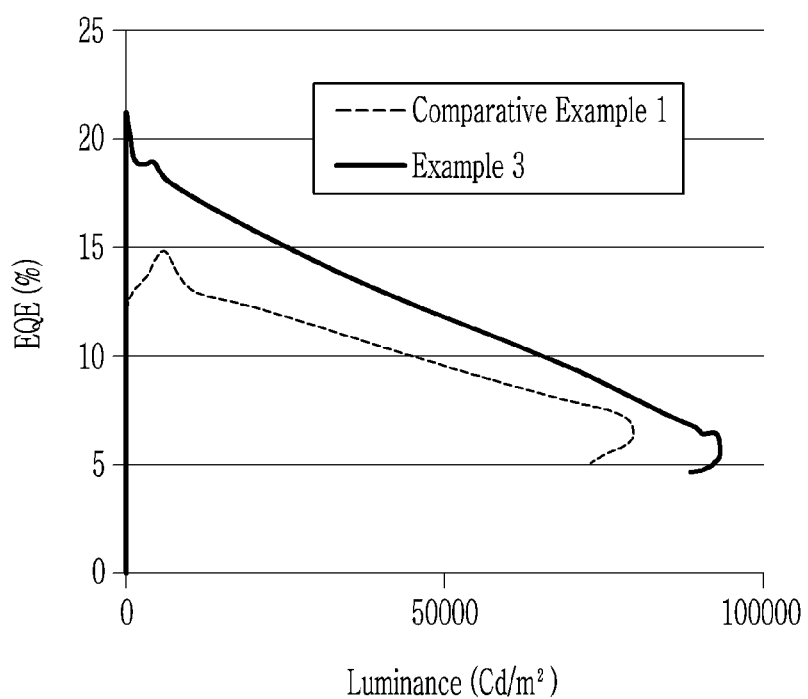

FIGS. 18 to 20 are graphs showing light emitting characteristics of the electroluminescent devices according to Example 3 and Comparative Example 1.

Referring to Table 7 and FIGS. 18 to 20, even though a different material for forming the self-assembled monomolecular layer is used, Example 3 including the self-assembled monomolecular layer exhibits excellent electron-hole balance and improved driving efficiency compared with Comparative Example 1 similar to the results of Evaluations 4 to 5.

Figure 21:
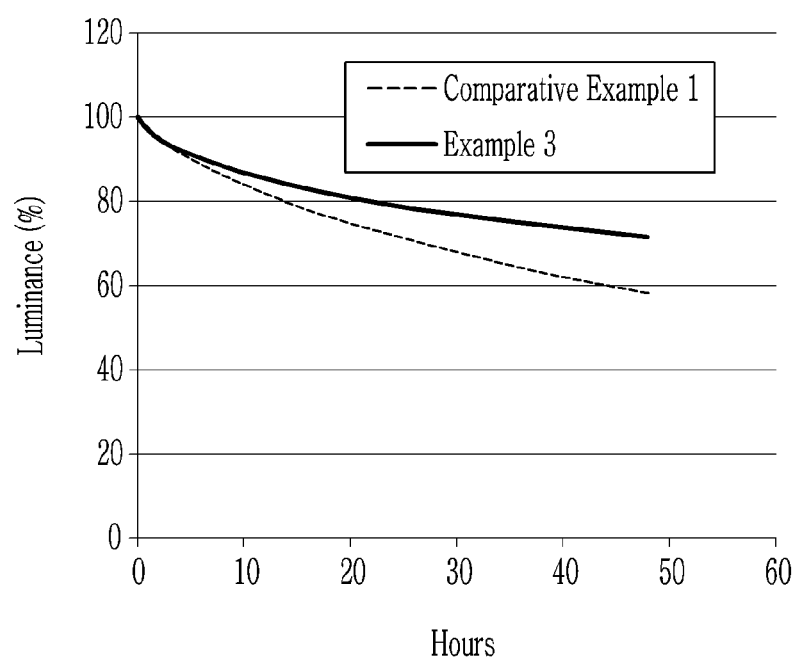
FIGS. 21 to 22 are graphs showing life-span characteristics of the electroluminescent devices according to Example 3 and Comparative Example 1.
Figure 22:
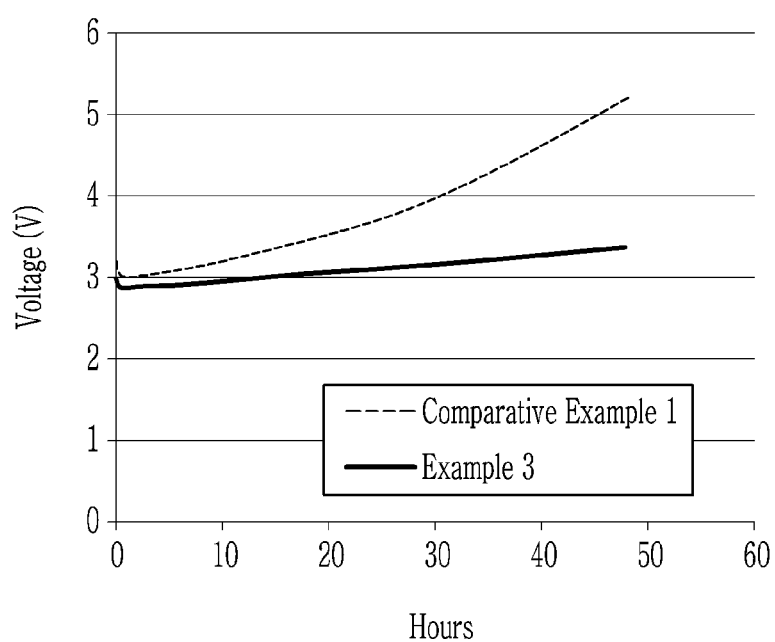

Meanwhile, life-span characteristics of the electroluminescent devices according to Example 3 and Comparative Example 1 are measured, and the results are shown in Table 8 and FIGS. 21 and 22.

TABLE 8

| | T75 (hr) | Current (mA) | Initial P. current (μA) | Initial voltage (V) |
|---|---|---|---|---|
| Example 3 | 36.9 | 0.781 | 17.666 | 3.0 |
| Comp. Example 1 | 20.11 | 0.821 | 17.799 | 3.2 |

FIGS. 21 to 22 are graphs showing life-span characteristics of the electroluminescent devices according to Example 3 and Comparative Example 1.

Referring to Table 8 and FIGS. 21 to 22, similar to the results of Evaluations 4 to 5, even though a different material for forming the self-assembled monomolecular layer is used, Example 3 including the self-assembled monomolecular layer exhibits greater stability over time compared with Comparative Example 1 and in addition, minimal device degradation depending on a driving time.

While this disclosure has been described in connection with what is presently considered to be practical example embodiments, it is to be understood that the invention is not limited to the disclosed embodiments. On the contrary, it is intended to cover various modifications and equivalent arrangements included within the spirit and scope of the appended claims.

Description of Symbols

10: electroluminescent device
110: first electrode
130: hole transport layer
100: substrate
120: hole injection layer
140: emission layer
141: quantum dot
151: self-assembled monomolecule
170: second electrode
150: self-assembled monomolecular layer
160: electron transport layer

What is claimed is:

1. An electroluminescent device comprising
a first electrode;
a hole transport layer disposed on the first electrode;
an emission layer disposed on the hole transport layer, the emission layer comprising quantum dots;
a self-assembled monomolecular layer disposed on the emission layer, the self-assembled monomolecular layer comprising self-assembled monomolecules;
an electron transport layer disposed on the self-assembled monomolecular layer; and
a second electrode disposed on the electron transport layer,
wherein the self-assembled monomolecules are attached to the surface of the quantum dots.

2. The electroluminescent device of claim 1, wherein the self-assembled monomolecules have a first terminal end proximate to the surface of the quantum dots and a second terminal end distal from the surface of the quantum dots, and
the first terminal end forms a chemical bond with the surface of the quantum dots.

3. The electroluminescent device of claim 2, wherein the first terminal end comprises carboxylate, phosphoryl, or a combination thereof.

4. The electroluminescent device of claim 1, wherein the self-assembled monomolecule is derived from a compound represented by Chemical Formula 1:

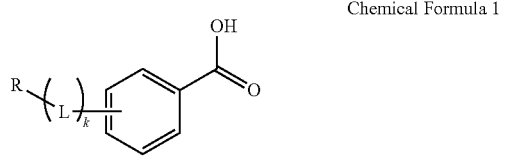

Chemical Formula 1 wherein, in Chemical Formula 1,
L is —C($R_a$)($R_b$)—, —O—, —S—, —Se—, —N($R_c$)—, —P($R_d$)—, —C(O)O—, —CO—, or a combination thereof, wherein $R_a$, $R_b$, $R_c$, and $R_d$ are independently hydrogen, a halogen, a substituted or unsubstituted C1 to C20 alkyl group, a substituted or unsubstituted C1 to C20 aryl group, or a substituted or unsubstituted C1 to C20 heteroaryl group,
R is hydrogen, a halogen, a substituted or unsubstituted C1 to C20 alkyl group, a substituted or unsubstituted C1 to C20 cycloalkyl group, a substituted or unsubstituted C1 to C20 aryl group, or a substituted or unsubstituted C1 to C20 heteroaryl group, and k is an integer of 0 to 4.

5. The electroluminescent device of claim 4, wherein the self-assembled monomolecule is derived from a compound represented by Chemical Formula 2:

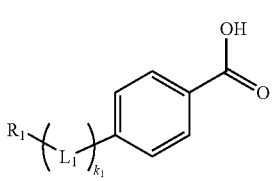

Chemical Formula 2 wherein, in Chemical Formula 2, $L_1$ is —$C(R_a)(R_b)$—, —O—, or a combination thereof, wherein $R_a$, $R_b$, $R_c$, and $R_d$ are independently hydrogen, a halogen, a substituted or unsubstituted C1 to C20 alkyl group, a substituted or unsubstituted C1 to C20 aryl group, or a substituted or unsubstituted C1 to C20 heteroaryl group, $R_1$ is hydrogen, a halogen, or a substituted or unsubstituted C1 to C20 alkyl group, and $k_1$ is 0 or 1.

6. The electroluminescent device of claim 1, wherein the self-assembled monomolecules are dissolved in a solvent comprising water, ethanol, methanol, propanol, butanol, acetic acid, ethylene glycol, diethylene glycol, glycerine, isopropyl alcohol, 2-methoxy ethanol, acetone, acetonitrile, or a combination thereof.

7. The electroluminescent device of claim 1, wherein the self-assembled monomolecular layer has an average thickness of about 0.1 nanometers to about 5 nanometers.

8. The electroluminescent device of claim 1, wherein the quantum dots comprise a core comprising a first semiconductor nanocrystal and a shell comprising a second semiconductor nanocrystal disposed on the core and having a composition different from that of the first semiconductor nanocrystal.

9. The electroluminescent device of claim 8, wherein the first semiconductor nanocrystal and the second semiconductor nanocrystal independently comprise a Group II-VI compound, a Group III-V compound, a Group IV-VI compound, a Group IV element or compound, a Group I-III-VI compound, a Group I-II-IV-VI compound that does not comprise Cd, or a combination thereof.

10. The electroluminescent device of claim 1, wherein at least a portion of a surface of the quantum dots is attached to a hydrophobic ligand, comprising a compound derived from a carboxylic acid, a compound derived from thiol, or a combination thereof.

11. The electroluminescent device of claim 1, wherein the quantum dots emit a first light in a wavelength region.

12. The electroluminescent device of claim 11, wherein the first light is at least one of a first wavelength region of about 380 nanometers to about 488 nanometers, a second wavelength region of about 490 nanometers to about 510 nanometers, a third wavelength region of about 511 nanometers to about 580 nanometers, a fourth wavelength region of about 582 nanometers to about 600 nanometers, or a fifth wavelength region of about 620 nanometers to about 680 nanometers.

13. The electroluminescent device of claim 1, wherein the hole transport layer comprises a poly(3,4-ethylenedioxythiophene), a poly(styrenesulfonate), a poly-N-vinylcarbazole, a polyphenylenevinylene, a polyparaphenylenevinylene, a polymethacrylate, a polyarylamine, a polyaniline, a polypyrrole, a poly(9,9-dioctylfluorene), poly(spiro-bifluorene), or a derivative of any of the aforementioned compounds, tris(4-carbazol-9-ylphenyl)amine, N,N'-diphenyl-N,N'-bis(3-methylphenyl)-(1,1'-biphenyl)-4,4'-diamine, N,N'-bis(3-methylphenyl)-N,N'-bis(phenyl)-2,7-diamino-9, 9-spiro bifluorene, N,N'-bis(3-methylphenyl)-N,N'-bis(phenyl)-9,9-dioctylfluorene, N,N'-di(naphthalen-1-yl)-N—N'-diphenyl-benzidine, N2,N7-di(naphthalen-1-yl)-9,9-dioctyl-N2,N7-diphenyl-9H-fluorene-2,7-diamine, tris(3-methylphenylphenylamino)-triphenylamine, dipyrazino[2,3-f:2',3'-h]quinoxaline-2,3,6,7,10,11-hexanecarbonitrile, di-[4-(N,N-di-p-tolyl-amino)-phenyl] cyclohexane, N,N'-(4,4'-(cyclohexan-1,1-diyl)bis(4,1-phenylene))bis(N-(4-(6-(2-ethyloxetan-2-yloxy)hexyl)phenyl)-3,4,5-trifluoroaniline), 4,4'-bis(N-carbazolyl)-1,1'-biphenyl, 2,6-bis(3-(9H-carbazol-9-yl)phenyl)pyridine, poly(N,N'-diphenyl-N,N'-bis(3-methylphenyl)-(1,1'-biphenyl)-4,4'-diamine), a nickel oxide, a molybdenum oxide, a copper oxide, a vanadium oxide, a chromium oxide, a graphene oxide, or a combination thereof.

14. The electroluminescent device of claim 1, wherein the electron transport layer comprises inorganic material nanoparticles, a quinolone-based compound, a triazine-based compound, a quinoline-based compound, a triazole-based compound, a naphthalene-based compound, or a combination thereof.

15. The electroluminescent device of claim 14, wherein the electron transport layer comprises a cluster layer of inorganic material nanoparticles.

16. The electroluminescent device of claim 14, wherein the inorganic material nanoparticles comprise salts of metals comprising zinc, magnesium, tin, zirconium, titanium, aluminum, or a combination thereof.

17. The electroluminescent device of claim 1, wherein a hole injection layer is further included between the hole transport layer and the first electrode.

18. A display device comprising the electroluminescent device of claim 1.

19. An electroluminescent device comprising
a first electrode;
a hole transport layer disposed on the first electrode;
an emission layer disposed on the hole transport layer, the emission layer comprising quantum dots;
a self-assembled monomolecular layer disposed on the emission layer, the self-assembled monomolecular layer comprising self-assembled monomolecules;
an electron transport layer disposed on the self-assembled monomolecular layer; and
a second electrode disposed on the electron transport layer,
wherein the self-assembled monomolecule is derived from a compound represented by Chemical Formula 1:

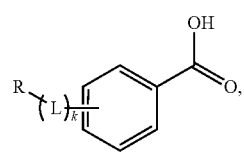

Chemical Formula 1 wherein, in Chemical Formula 1

L is —C($R_a$)($R_b$)—, —O—, —S—, —Se—, —N($R_c$)—, —P($R_d$)—, —C(O)O—, —CO—, or a combination thereof, wherein $R_a$, $R_b$, $R_c$, and $R_d$ are independently hydrogen, a halogen, a substituted or unsubstituted C1 to C20 alkyl group, a substituted or unsubstituted C1 to C20 aryl group, or a substituted or unsubstituted C1 to C20 heteroaryl group, R is hydrogen, a halogen, a substituted or unsubstituted C1 to C20 alkyl group, a substituted or unsubstituted C1 to C20 cycloalkyl group, a substituted or unsubstituted C1 to C20 aryl group, or a substituted or unsubstituted C1 to C20 heteroaryl group, and k is an integer of 0 to 4.

20. The electroluminescent device of claim 19, wherein the electron transport layer comprises inorganic material nanoparticles, a quinolone-based compound, a triazine-based compound, a quinoline-based compound, a triazole-based compound, a naphthalene-based compound, or a combination thereof.

21. The electroluminescent device of claim 20, wherein the electron transport layer comprises the inorganic material nanoparticles, and the inorganic material nanoparticles include a cluster layer of inorganic material nanoparticles, which comprise salts of metals comprising zinc, magnesium, tin, zirconium, titanium, aluminum, or a combination thereof.

22. An electroluminescent device comprising
a first electrode;
a hole transport layer disposed on the first electrode;
an emission layer disposed on the hole transport layer, the emission layer comprising quantum dots;
a self-assembled monomolecular layer disposed on the emission layer, the self-assembled monomolecular layer comprising self-assembled monomolecules;
an electron transport layer disposed on the self-assembled monomolecular layer; and
a second electrode disposed on the electron transport layer,
wherein the electron transport layer comprises inorganic material nanoparticles, a quinolone-based compound, a triazine-based compound, a quinoline-based compound, a triazole-based compound, a naphthalene-based compound, or a combination thereof.

23. The electroluminescent device of claim 22, wherein the electron transport layer comprises the inorganic material nanoparticles, and the inorganic material nanoparticles include a cluster layer of inorganic material nanoparticles, which comprise salts of metals comprising zinc, magnesium, tin, zirconium, titanium, aluminum, or a combination thereof.

* * * * *